US011255611B2

(12) United States Patent
Dinnage et al.

(10) Patent No.: US 11,255,611 B2
(45) Date of Patent: Feb. 22, 2022

(54) ACTIVE/PASSIVE COOLING SYSTEM

(71) Applicant: Munters Corporation, Selma, TX (US)

(72) Inventors: Paul A. Dinnage, New Braunfels, TX (US); Wei Fang, San Antonio, TX (US)

(73) Assignee: Munters Corporation, Selma, TX (US)

( * ) Notice: Subject to any disclaimer, the term of this patent is extended or adjusted under 35 U.S.C. 154(b) by 60 days.

(21) Appl. No.: 15/646,731

(22) Filed: Jul. 11, 2017

(65) Prior Publication Data

US 2018/0038660 A1 Feb. 8, 2018

Related U.S. Application Data

(60) Provisional application No. 62/369,957, filed on Aug. 2, 2016.

(51) Int. Cl.
*F28D 15/06* (2006.01)
*F25B 23/00* (2006.01)
(Continued)

(52) U.S. Cl.
CPC ............ *F28D 15/06* (2013.01); *F25B 23/006* (2013.01); *F25B 25/005* (2013.01); *F25B 49/00* (2013.01);
(Continued)

(58) Field of Classification Search
CPC .. F28D 15/0266; F28D 15/06; F28D 15/0273; F28D 15/04; H05K 7/20318;
(Continued)

(56) References Cited

U.S. PATENT DOCUMENTS 3,807,493 A * 4/1974 Stewart ............... F28D 15/0275
165/104.14
4,216,903 A * 8/1980 Giuffre ............... F24D 11/0235
237/8 R
(Continued)

FOREIGN PATENT DOCUMENTS

CN 101573564 A 11/2009
CN 203010813 U 6/2013
(Continued)

OTHER PUBLICATIONS

International Search Report and Written Opinion dated Sep. 28, 2017, in International Application No. PCT/US2017/041682.
(Continued)

*Primary Examiner* — Joel M Attey
*Assistant Examiner* — For K Ling
(74) *Attorney, Agent, or Firm* — Venable LLP

(57) ABSTRACT

An airstream cooling assembly includes an evaporator and a first and second condenser. The evaporator is configured to have a first airstream directed over its outer surface and to change the phase of a primary cooling medium from liquid to gas. The first condenser is configured to have a second airstream directed over its outer surface, transfer heat from the primary cooling medium, and change the phase of the primary cooling medium from gas to liquid. The second condenser is configured to accept a secondary cooling medium, and when accepting the secondary cooling medium, to receive the primary cooling medium from the evaporator, transfer heat from the primary cooling medium, and change the phase of the primary cooling medium from gas to liquid. The evaporator is configured to receive the primary cooling medium in the liquid phase from at least one of the first condenser and the second condenser.

24 Claims, 12 Drawing Sheets

(51) Int. Cl.
*H05K 7/20* (2006.01)
*F28D 15/02* (2006.01)
*F25B 25/00* (2006.01)
*F25B 49/00* (2006.01)
*F28D 15/04* (2006.01)

(52) U.S. Cl.
CPC ..... *F28D 15/0266* (2013.01); *F28D 15/0275* (2013.01); *F28D 15/04* (2013.01); *H05K 7/20745* (2013.01); *H05K 7/20827* (2013.01); *F25B 2700/195* (2013.01); *F25B 2700/21163* (2013.01)

(58) Field of Classification Search
CPC ............ H05K 7/20663; H05K 7/20636; F24F 2012/005
USPC ..................................................... 165/104.21
See application file for complete search history.

(56) References Cited

U.S. PATENT DOCUMENTS

| | | | |
|---|---|---|---|
| 4,314,601 A * | 2/1982 | Giuffre | F24D 11/0242 165/274 |
| 4,476,922 A | 10/1984 | Heilig, Jr. et al. | |
| 4,573,524 A * | 3/1986 | Kotaka | F23D 14/66 165/104.14 |
| 5,333,677 A * | 8/1994 | Molivadas | F24S 10/504 165/272 |
| 5,921,315 A | 7/1999 | Dinh | |
| 6,119,767 A * | 9/2000 | Kadota | F28D 15/0233 165/104.33 |
| 6,131,647 A * | 10/2000 | Suzuki | F28D 15/0266 165/104.14 |
| 6,205,803 B1 | 3/2001 | Scaringe | |
| 6,220,337 B1 * | 4/2001 | Chen | F28D 15/0266 165/10 |
| 6,442,959 B1 | 9/2002 | Sone | |
| 6,550,530 B1 | 4/2003 | Bilski | |
| 6,578,629 B1 | 6/2003 | Trent | |
| 6,591,902 B1 | 7/2003 | Trent | |
| 6,658,874 B1 * | 12/2003 | Trent | F24F 3/1405 165/298 |
| 6,917,522 B1 | 7/2005 | Erturk et al. | |
| 7,093,647 B2 * | 8/2006 | Take | F28D 15/025 165/104.21 |
| 7,810,551 B2 * | 10/2010 | Ippoushi | F28D 15/0266 165/104.28 |
| 7,845,167 B2 * | 12/2010 | Miyagawa | F28D 15/06 60/320 |
| 7,903,404 B2 | 3/2011 | Tozer et al. | |
| 7,958,935 B2 | 6/2011 | Belits et al. | |
| 7,969,727 B2 | 6/2011 | Tozer et al. | |
| 8,033,322 B1 | 10/2011 | Trent | |
| 8,164,902 B2 | 4/2012 | Matsushima et al. | |
| 8,991,194 B2 | 3/2015 | Edwards et al. | |
| 9,103,572 B2 | 8/2015 | Edwards et al. | |
| 9,113,579 B2 | 8/2015 | Cottet et al. | |
| 9,271,429 B2 | 2/2016 | Mashiko et al. | |
| 9,326,431 B2 | 4/2016 | Matsushita et al. | |
| 9,348,378 B2 | 5/2016 | Kondo et al. | |
| 9,398,731 B1 | 7/2016 | Imwalle et al. | |
| 9,441,888 B2 | 9/2016 | Chang et al. | |
| 9,500,413 B1 | 11/2016 | Rice | |
| 9,521,786 B2 | 12/2016 | Rice et al. | |
| 2002/0166655 A1 * | 11/2002 | Sugito | F28D 15/0233 165/104.21 |
| 2003/0029175 A1 * | 2/2003 | Lee | F24F 5/0042 62/3.7 |
| 2003/0061824 A1 | 4/2003 | Marsala | |
| 2003/0180589 A1 * | 9/2003 | Sarraf | H01M 8/04059 29/890.032 |
| 2005/0120737 A1 | 6/2005 | Borror et al. | |
| 2005/0161202 A1 | 7/2005 | Merkys et al. | |
| 2007/0209782 A1 | 9/2007 | Wyatt et al. | |
| 2008/0141664 A1 * | 6/2008 | Bidner | F01N 5/02 60/320 |
| 2009/0211734 A1 * | 8/2009 | Benstead | F28D 15/0266 165/104.21 |
| 2010/0061062 A1 * | 3/2010 | Madsen | F28D 15/0266 361/701 |
| 2010/0107658 A1 | 5/2010 | Cockrell | |
| 2010/0204838 A1 | 8/2010 | DiPaolo et al. | |
| 2010/0232110 A1 * | 9/2010 | Ippoushi | F25B 39/02 361/699 |
| 2011/0232873 A1 * | 9/2011 | Seki | F25B 25/005 165/104.21 |
| 2011/0259573 A1 * | 10/2011 | Ezawa | F24F 5/0007 165/253 |
| 2011/0308262 A1 * | 12/2011 | Inadomi | F28D 15/0266 62/126 |
| 2012/0297807 A1 | 11/2012 | Canney et al. | |
| 2013/0077245 A1 * | 3/2013 | Gradinger | F28D 1/035 361/700 |
| 2013/0098085 A1 | 4/2013 | Judge et al. | |
| 2013/0168059 A1 | 7/2013 | Werner et al. | |
| 2014/0014303 A1 | 1/2014 | Rice et al. | |
| 2014/0137573 A1 | 5/2014 | Lin et al. | |
| 2014/0137582 A1 | 5/2014 | Louvar et al. | |
| 2014/0157821 A1 | 6/2014 | Schrader et al. | |
| 2014/0163744 A1 | 6/2014 | Dolcich et al. | |
| 2015/0062806 A1 | 3/2015 | Shelnutt et al. | |
| 2015/0143831 A1 | 5/2015 | Chou et al. | |
| 2015/0296665 A1 | 10/2015 | Alonso | |
| 2016/0097602 A1 | 4/2016 | Rice et al. | |
| 2016/0330873 A1 | 11/2016 | Farshchian et al. | |
| 2016/0381839 A1 | 12/2016 | Farshchian et al. | |
| 2017/0042067 A1 | 2/2017 | Parizeau et al. | |
| 2017/0055377 A1 | 2/2017 | Rice et al. | |
| 2017/0079167 A1 | 3/2017 | Samadiani et al. | |

FOREIGN PATENT DOCUMENTS

| | | |
|---|---|---|
| CN | 205014688 U | 2/2016 |
| JP | H10-238972 A | 9/1998 |
| WO | 2012/164261 A2 | 12/2012 |
| WO | 2016/053227 A1 | 4/2016 |
| WO | 2016/155606 A1 | 10/2016 |

OTHER PUBLICATIONS

Marcininchen et al., "Towards development of a passive datacenter cooling technology: On-server thermosyphon cooling loop under dynamic workload", Laboratory of Heat and Mass Transfer (LTCM), École Polytechnique Fédérate de Lausanne (EPFL), Lausanne, Switzerland, May 2014 (available at http://www.researchgate.net/publication/286563844.

Carter et al., "Thermosyphon Cooler Hybrid System for Water Saving in an Energy-Efficient HPC Data Center: Modeling and Installation", National Renewable Energy Laboratory;Conference Paper NREL/CP-2C00-66690, Feb. 2017 (available at www.nrel.gov/publications).

"Computer Cooling"; Wikipedia, Apr. 19, 2017 (Available at https://en.wikipedia.org/wiki/Computer_cooling (last accessed Apr. 19, 2017)).

Wu, et al. "Cold Energy Storage Systems Using Heat Pipe Technology for Cooling Data Centers", Frontiers in Heat Pipes (FHP), vol. 2, No. 1, pp. 1-7 (2011).

"Data Center Solutions with Acoustic Panel Plenums", SEMCO LLC (2017).

"Chilled Water Plant Solutions: Thermosyphon Free-Cooling" Airtron Canada.

Dunnavant, Keith; "Indirect Air-Side Economizer Cycle Data Center Heat Rejection", ASHRAE Journal, Mar. 2011, pp. 44-54.

"Liebert DS, User Manual-28-105kW, 8-30 Tons, Upflow and Downflow 50/60Hz", Emerson Network Power, SL-18825_REV13_07-13.

"Energy Recovery Wheel, Technical Guide" SEMCO, LLC (2015).

(56) References Cited

OTHER PUBLICATIONS

Written Opinion dated May 9, 2020, in Singapore Patent Application No. 11201900902R.
Office Action dated Mar. 19, 2020, in Chinese Patent Application No. 201780056142.1.
European Search Report dated Mar. 10, 2020 in Euorpean Application No. 17837372.6.

* cited by examiner

ACTIVE/PASSIVE COOLING SYSTEM

CROSS REFERENCE TO RELATED APPLICATION

This application claims the benefit under 35 U.S.C. § 119(e) of U.S. Provisional Patent Application No. 62/369,957, filed Aug. 2, 2016, and titled "Active/Passive Thermosyphon for use in Data Center Cooling," the entirety of which is incorporated herein by reference.

FIELD OF THE INVENTION

This invention relates to cooling systems and systems and methods to control them. In particular, this invention relates to an airstream cooling system having both active and passive modes. A particularly suitable application, for example, is in data center cooling systems.

BACKGROUND OF THE INVENTION

Data centers often require large amounts of energy to operate. The servers in these data centers generate a large amount a heat, requiring cooling. To reduce the energy use of data centers, more efficient cooling systems are desired.

Heat pipes and thermosyphons are devices that transfer energy from a higher temperature evaporator section to a lower temperature condenser section by the evaporation and condensation of a closed refrigerant volume. Transfer of the refrigerant from the condenser section to the evaporator section takes place either by gravity or capillary force. Heat pipes have been used in data center cooling as indirect economizers. In these installations, warm air from a data center, for example, is recirculated through the evaporator section of a heat pipe where the enclosed refrigerant is vaporized by the heat from the data center, cooling the data center air. Cooler ambient air is blown over the condenser section of the heat pipe where the refrigerant vapor is condensed and the data center heat expelled. In some applications, the ambient air is first adiabatically cooled with an evaporative cooler prior to its passage through the condenser section of the heat pipe to provide a lower temperature heat sink. In another configuration, the condenser section of the heat pipe may be sprayed with water at the same time as the ambient air passes across its surface, providing a heat sink temperature close to the ambient wet bulb temperature.

In these implementations, the heat pipes and thermosyphons are limited by the ambient temperature conditions and may not provide sufficient heat rejection when the ambient temperatures are high. One such solution to this limitation is a pumped refrigerant system that incorporates a mechanical cooling system, such as a direct expansion (DX) cooling system (an active mode), with a near passive mode that operates similarly to a thermosyphon. These systems include a pump to move liquid refrigerant from the condenser to the evaporator. By utilizing a pump, the flow of refrigerant can be controlled independently of the evaporator and condenser pressure drops and the effects of gravity. This approach is near passive because only a small amount of power is needed for the pump to transfer a significant amount of thermal energy. In the pumped refrigerant systems, the pump can be turned off and, by operating valves, compressors and expansion valves can be integrated into the system refrigerant flow to allow the system to act as a direct expansion cooling system.

System design constraints in direct expansion systems generally call for modest pressure drops in the evaporator and condenser section of the system to provide even refrigerant flow through the multiple parallel evaporator and condenser circuits of the system. It is because of these pressure drops that the system requires a pump to circulate the refrigerant fluid when running in the near passive mode. As the refrigerant circuit includes a compressor system, the refrigerant volume also needs to include oil for lubrication. There are various design and operational constraints, such as best practices for refrigerant velocity, (so called "oil management") for the pumped refrigerant systems that ensure oil does not get trapped in the various piping lengths of the system and returns reliably to the compressor where it is needed. These oil management constraints become problematic when operating in the pumped (near passive mode) because the flow paths and flow rates for the pumped mode may not coincide with the rules required for the DX mode. Refrigerant volume for proper operation within the system may also be quite different during the pumped mode and the DX mode due to differing available superheat and sub-cool levels, and coil flooding levels, for example.

Cooling systems with further reductions in energy use are thus desired, as are cooling systems that do not require oil management in a passive or near passive mode.

SUMMARY OF THE INVENTION

In one aspect, the present invention relates to an airstream cooling assembly that is operable in passive and active modes. The airstream cooling assembly includes an evaporator, a passive condenser, and a heat exchanger. The evaporator has an outer surface and contains a primary cooling medium. The evaporator is configured to have a first airstream directed over the outer surface thereof and, when the first airstream is directed over the outer surface, to change the phase of the primary cooling medium from liquid to gas. The passive condenser has an outer surface and is fluidly coupled to the evaporator. The heat exchanger is also fluidly coupled to the evaporator. In the passive mode, the passive condenser is configured to receive the primary cooling medium in the gas phase from the evaporator, receive a second airstream directed over its outer surface to change the phase of the primary cooling medium from gas to liquid, and supply the primary cooling medium in the liquid phase to the evaporator. In the active mode, the heat exchanger is configured to receive the primary cooling medium in the gas phase from the evaporator, transfer heat from the primary cooling medium unit to change the primary cooling medium from a gas to a liquid, and supply the primary cooling medium in the liquid phase to the evaporator.

In another aspect, the invention relates to an airstream cooling assembly that includes a heat exchanger, and a passive condenser. The evaporator has an outer surface and contains a primary cooling medium. The evaporator is configured to have a first airstream directed over the outer surface thereof and, when the first airstream is directed over the outer surface, to change the phase of the primary cooling medium from liquid to gas. The heat exchanger is fluidly coupled to the evaporator and configured to accept a secondary cooling medium. When the heat exchanger is accepting the secondary cooling medium, the heat exchanger is configured to receive the primary cooling medium in the gas phase from the evaporator, transfer heat from the primary cooling medium, and change the phase of the primary cooling medium from gas to liquid. The passive condenser has an outer surface and is fluidly coupled to the evaporator.

The passive condenser is configured to have a second airstream directed over the outer surface thereof. When the heat exchanger is not accepting the secondary cooling medium, the passive condenser is configured to receive the primary cooling medium in the gas phase from the evaporator, transfer heat from the primary cooling medium, and change the phase of the primary cooling medium from gas to liquid. The evaporator is configured to receive the primary cooling medium in the liquid phase from either the heat exchanger or the passive condenser.

In a further aspect, the invention relates to an airstream cooling assembly includes an evaporator, a passive condenser, and a heat exchanger. The evaporator has an outer surface and contains a primary cooling medium. The evaporator is configured to have an airstream directed over the outer surface thereof and, when the airstream is directed over the outer surface, to change the phase of the primary cooling medium from liquid to gas. The passive condenser has an outer surface and is coupled to the evaporator. The passive condenser is configured to have ambient air directed over the outer surface thereof, transfer heat from the primary cooling medium, and change the phase of the primary cooling medium from gas to liquid. The heat exchanger is coupled to the evaporator and configured to selectively accept heat by mechanical cooling, transfer heat from the primary cooling medium, and change the phase of the primary cooling medium from gas to liquid. The evaporator is configured to receive the primary cooling medium in the liquid phase from either the passive condenser or the heat exchanger. The evaporator is configured to receive the primary cooling medium in the liquid phase from the heat exchanger when the heat exchanger is accepting heat by mechanical cooling.

In still another aspect, the invention relates to method of cooling an airstream. The method includes directing an airstream over an outer surface of an evaporator to change a primary cooling medium contained therein from a liquid phase to a gas phase, and selectively utilizing one of a heat exchanger and a passive condenser to change the primary cooling medium from the gas phase to the liquid phase. Each of the heat exchanger and the passive condenser is coupled to the evaporator to receive the primary coolant in the gas phase from the evaporator and supply the primary cooling medium in the liquid phase to the evaporator.

In yet another aspect, the invention relates to an airstream cooling assembly including an evaporator, a first condenser, and a second condenser. The evaporator has an outer surface and contains a primary cooling medium. The evaporator is configured to have a first airstream directed over the outer surface thereof and, when the first airstream is directed over the outer surface, to change the phase of the primary cooling medium from liquid to gas. The first condenser has an outer surface and is coupled to the evaporator. The first condenser is configured to have a second airstream directed over the outer surface thereof, and when the second airstream is directed over the outer surface of the first condenser, to receive the primary cooling medium from the evaporator, transfer heat from the primary cooling medium, and change the phase of the primary cooling medium from gas to liquid. The second condenser is coupled to the evaporator and configured to accept a secondary cooling medium. When accepting the secondary cooling medium, the second condenser is configured to receive the primary cooling medium from the evaporator, transfer heat from the primary cooling medium, and change the phase of the primary cooling medium from gas to liquid. The evaporator is configured to receive the primary cooling medium in the liquid phase from at least one of the first condenser and the second condenser.

In still a further aspect, the invention relates to a modified heat pipe including a heat pipe and a second microchannel coil. The heat pipe contains a refrigerant therein and has an evaporator section and a condensing section. The condensing section is located in a condensing airstream. The heat pipe is a first microchannel coil. The second microchannel coil is fluidly coupled to the heat pipe to receive the cooling medium in the vapor phase from a vapor end of the heat pipe. The second microchannel coil is positioned in the condensing airstream prior to the condensing section of the heat pipe. The second microchannel coil is configured to facilitate condensation of the refrigerant and create a modified thermosiphon by allowing gravity return and recirculate the condensed refrigerant to the evaporator section of the heat pipe.

These and other aspects, objects, features, and advantages of the invention will become apparent from the following detailed description of illustrative embodiments thereof, which is to be read in connection with the accompanying drawings.

DETAILED DESCRIPTION OF THE PREFERRED EMBODIMENTS

Figure 1:
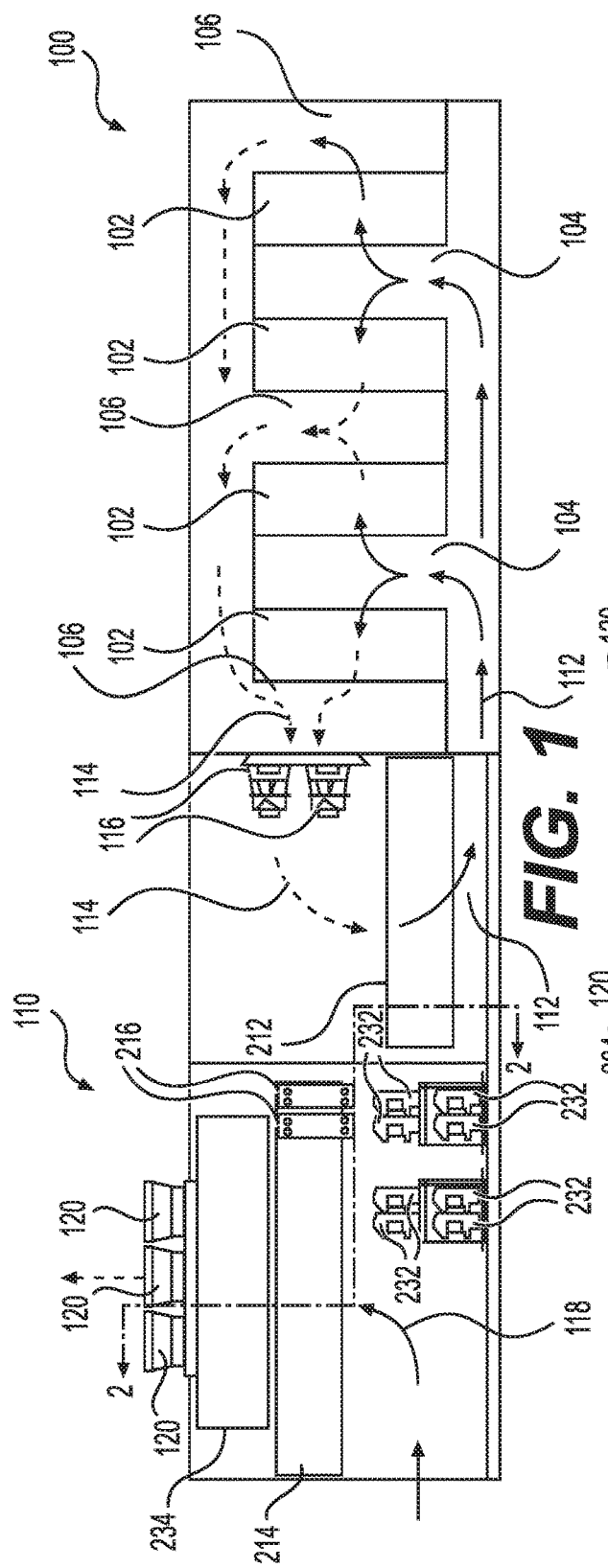
FIG. 1 is an elevation view of a data center using a cooling system according to a preferred embodiment of the invention.
Figure 2:
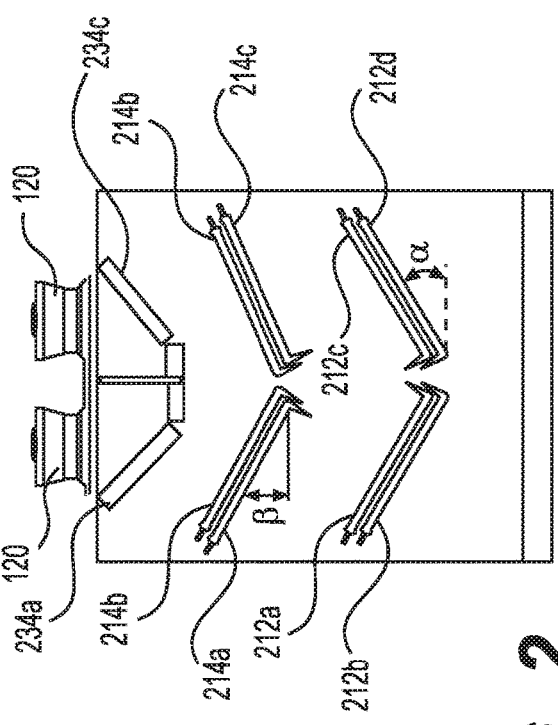
FIG. 2 is a cross-section view taken of the cooling system shown in FIG. 1 along line 2-2 in FIG. 1.

FIG. 1 shows a data center 100 having a cooling system 110 according to a preferred embodiment of the invention. FIG. 2 is a cross-section view of the cooling system 110 taken along line 2-2 in FIG. 1. Although the cooling system 110 is shown and described in reference to a data center 100, the cooling system 110 is not limited to this application and may be used in other suitable air cooling applications. Electronic components such as servers may be mounted on racks 102, and in a data center 100, these racks 102 may be arranged in rows forming aisles 104, 106, therebetween. One aisle 104 is a cold aisle, and another aisle 106 is a hot aisle. Cool, supply air 112 from the cooling system is directed into the cold aisle 104. The supply air 112 then passes from the cold aisle 104 through the racks and into the hot aisle 106. As the air passes through the racks 102, it draws heat from the electronic components, cooling them and resulting in hot air passing into the hot aisle 106. This air is then directed back to the cooling system 110 as hot, return air 114. Supply air fans 116 are used to draw the return air 114 from the data center 100, pass the return air 114 through the cooling system 110, where it is cooled, and then return the now cooled return air 114 to the data center 100 as supply air 112.

Figure 3:
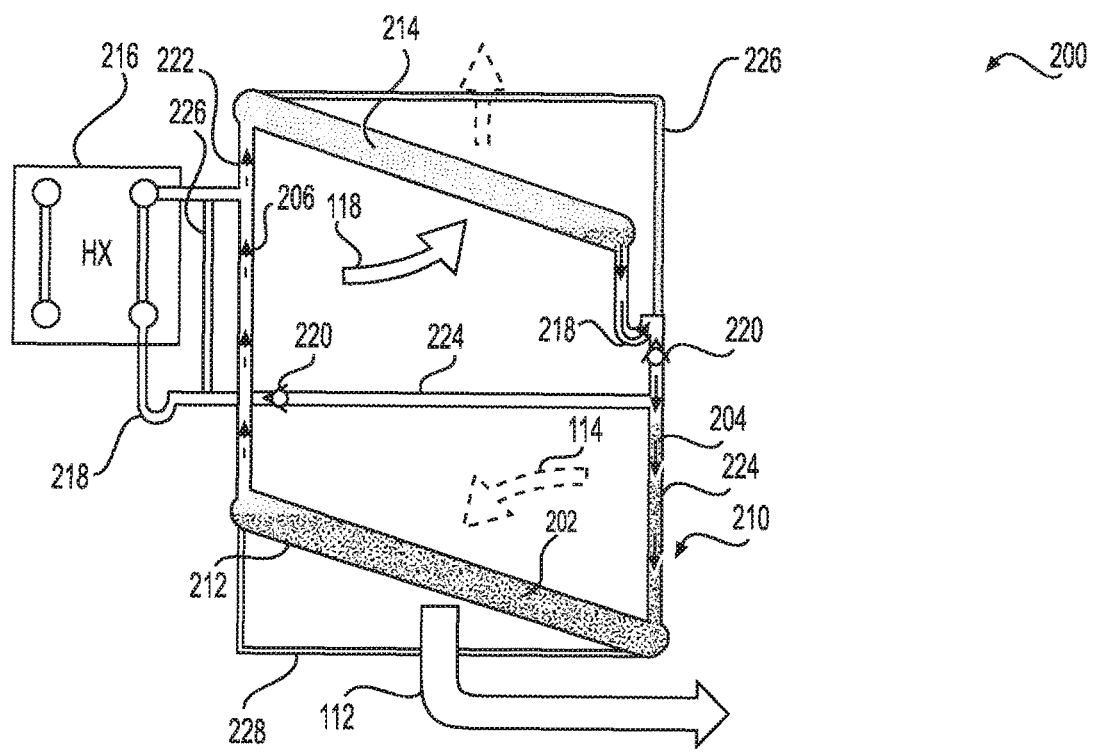
FIG. 3 is a schematic of an airstream cooling assembly according to a preferred embodiment of the invention operating in a passive mode.
Figure 4:
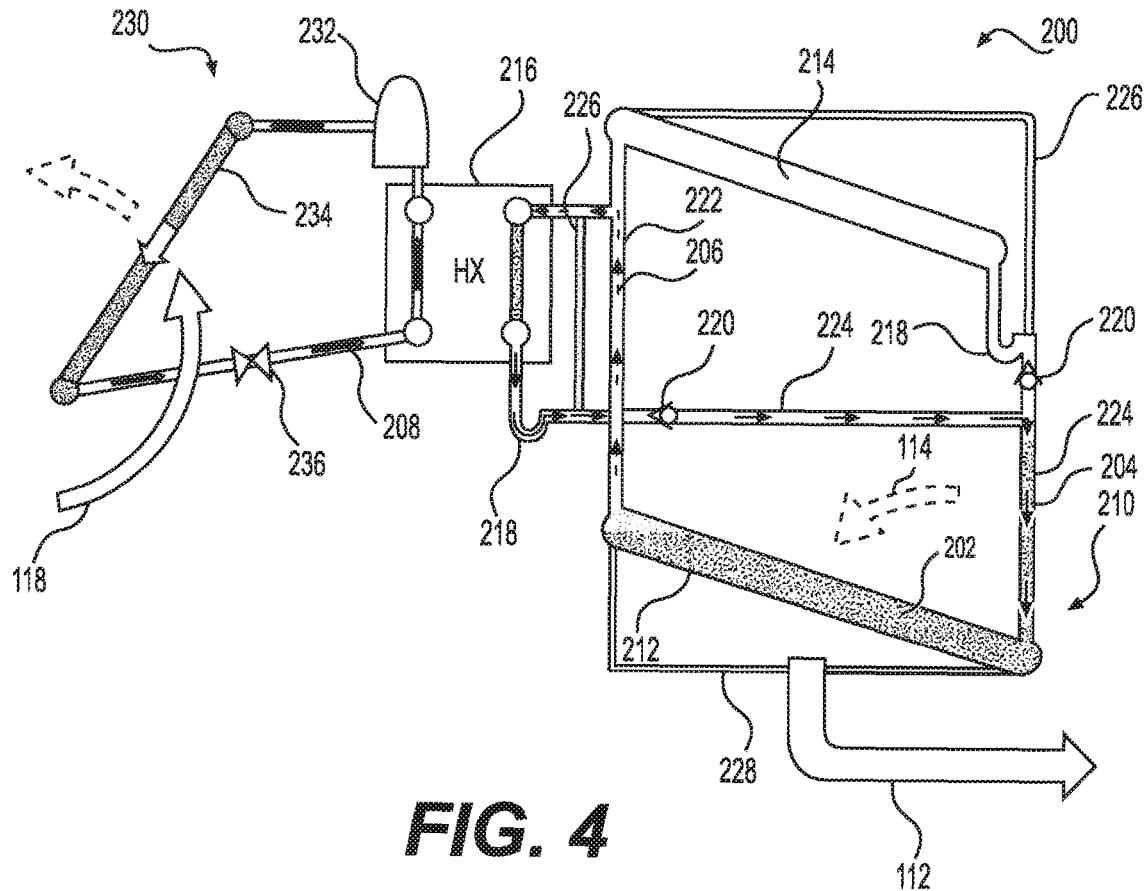
FIG. 4 is a schematic of the airstream cooling assembly shown in FIG. 3 operating in an active mode.

The cooling system 110 uses at least one airstream cooling assembly to cool the return air 114. The airstream cooling assemblies described in the following embodiments may also be referred to as an airstream cooling assembly loop or a loop. FIGS. 3 and 4 show an airstream cooling assembly 200 according to a first embodiment of the invention. The airstream cooling assembly 200 has two modes, a passive mode and an active mode. The passive mode may also be referred to as economization mode. FIG. 3 is a schematic of the airstream cooling assembly 200 in the passive mode, and FIG. 4 is a schematic airstream cooling assembly 200 in the active mode. The airstream cooling assembly 200 incorporates the efficiency of a thermosyphon with the ability to provide active cooling when available ambient free cooling sinks are not at a low enough temperature to provide sufficient heat rejection. This is accomplished by including two separate condensers 214, 216 in the loop 200, one of which (condenser 214) is used in the passive mode and the other of which (condenser 216) is used in the active mode.

The airstream cooling assembly 200 circulates a primary cooling medium 202 through a primary coolant loop 210. The primary cooling medium 202 circulates through the primary coolant loop 210 by natural circulation and gravity without the need for pumps and compressors. The primary cooling medium 202 may be any suitable refrigerant that changes phase from a liquid to a gas. As will be discussed further below, the primary coolant loop 210 does not require any moving parts. As a result, the available range of refrigerants that are suitable as primary cooling mediums 202 is greatly expanded compared to direct expansion (DX) cooling systems, for example, and suitable refrigerants include natural refrigerants such as water.

The primary coolant loop 210 includes an evaporator 212, and the primary cooling medium 202 is contained within the evaporator 212. In this embodiment, the evaporator 212 is a coil and preferably a one-pass, flooded coil. Any suitable coil may be used including, for example, microchannel coils, such as those described further below, or finned tube coils. In both the passive mode and the active mode, the return air 114 is directed over the outer surface of the evaporator 212 by the supply air fans 116. The hot, return air 114 evaporates the primary cooling medium 202 in the evaporator 212 as it passes over the outer surface of the evaporator 212. The phase change of the primary cooling medium 202 from a liquid phase 204 to a gas (or vapor) phase 206 cools the return air 114, allowing it to be returned to the data center 100 as cool, supply air 112. The vapor 206 then rises through a vapor pipe 222 to one of the two condensers 214, 216.

In the passive mode, shown in FIG. 3, the vapor 206 travels to a passive condenser 214 in the primary coolant loop 210. As with the evaporator 212, the passive condenser 214 of this embodiment is a coil, preferably a one-pass coil, and any suitable coil may be used including, for example, microchannel coils, such as those described further below, or tube coils (both finned and unfinned). Scavenger air 118 is drawn across an outer surface of the passive condenser 214 by scavenger fans 120 (see FIGS. 1 and 2). In this embodiment, the scavenger air 118 is ambient air drawn from the outdoor environment surrounding the cooling system 110. As the scavenger air 118 passes over the passive condenser 214, the heat of the primary cooling medium 202 contained in the passive condenser 214 is released to the scavenger air 118, condensing the vapor 206 to a liquid 204. Gravity then causes the primary cooling medium 202, now in the liquid phase 204, to flow down a liquid refrigerant line 224 and to return to the evaporator 212. The scavenger air 118 is exhausted to the outside by the scavenger fans 120.

When the ambient air conditions are not sufficient to cool the return air 114 to the desired conditions (e.g., temperature) for the supply air 112, the airstream cooling assembly 200 may be operated in an active mode shown in FIG. 4. In the active mode, the vapor 206 of the primary cooling medium 202 is condensed in an active condenser 216. In this embodiment, the active condenser 216 may also be referred to herein as a heat exchanger (FIX). In the active condenser 216, heat is transferred from the primary cooling medium 202 to a secondary cooling medium 208 of a secondary cooling system 230. The secondary cooling medium 208 may be any suitable refrigerant medium, including, for example, cooled (or chilled) water or a vapor change refrigerant used in a direct expansion cooling system. The active condenser 216 may be any suitable heat exchanger including, for example, a plate heat exchanger, a coaxial heat exchanger, or a shell and tube heat exchanger. As the heat of the primary cooling medium 202 is rejected to the secondary cooling medium 208, the primary cooling medium 202 condenses from a vapor 206 to a liquid 204. As with the passive condenser 214, gravity then causes the primary cooling medium 202, now in liquid phase 204, to flow down a liquid refrigerant line 224 and to return to the evaporator 212.

In this embodiment, the secondary cooling system 230 is a direct expansion (DX) cooling system 230 using the common refrigeration cycle, and the secondary cooling medium 208 is any suitable refrigerant used in such systems. The direct expansion cooling system 230 includes a compressor 232 to increase the pressure and temperature of the refrigerant 208 before it is cooled in a condenser 234. In this embodiment, the condenser 234 of the direct expansion cooling system 230 may also be cooled by the scavenger air 118 (see FIGS. 1 and 2). The refrigerant 208 then passes through an expansion valve 236, reducing its pressure and temperature, before returning to the active condenser 216.

Even in the active mode, the airstream cooling assembly 200 operates without the need of pumps, oils, or compressors in the primary coolant loop 210. The airstream cooling assembly 200 even operates without valves to switch between modes. Instead, the vapor 206 of the primary cooling medium 202 naturally travels to the colder of the two condensers 214, 216 to condense. Thus, by activating the secondary cooling system 230 to cool the active condenser 216, the airstream cooling assembly 200 automatically switches from passive mode to active mode (assuming the temperature in the active condenser 216 is lower than in the passive condenser 214) and by deactivating the secondary cooling system 230, the loop 200 searches back to the passive mode. As described below, a controller 240 may be used to activate and deactivate the secondary cooling system 230. Another advantage of the airstream cooling assembly 200 attributable to the lack of moving parts is that no oil is required, allowing the primary cooling medium 202 to flow outside of refrigerant velocities commonly required to entrain and keep oil circulating within the primary loop 210.

Although the condensers 214, 216 of the airstream cooling assembly 200 are shown in parallel in FIGS. 3 and 4, the condensers 214, 216 may also be arranged in series so the outlet of one of the active or passive condensers 214, 216 is upstream of and feeds into the inlet of the other condenser 214, 216. The primary coolant loop 210 may also include traps 218 and/or check valves 220 after each of the condensers 214, 216. The traps 218 and check valves 220 prevent reverse flow of the primary cooling medium 202 through the condenser 214, 216 that is not currently operating in a given mode.

Vent lines 226 may be located after the traps 218 of each condenser 214, 216 and connect to the inlet of the respective condenser 214, 216. These vent lines 226 allow any gas entrained in the liquid 204 of the primary cooling medium 202 to escape to the vapor side of the loop and thus assist the liquid flow by gravity to the evaporator 212.

Bubbles that form during evaporation of the primary cooling medium 202 in the evaporator 212 may entrain liquid as they rise in the channels of the evaporator 212. An entrained liquid return line 228 may be located at the outlet of the evaporator 212 and connect to the inlet header of the evaporator 212, allowing this entrained liquid to return to the evaporator inlet header without having to flow counter to the boiling flow path in the evaporator 212.

Because the airstream cooling assembly 200 of this embodiment operates in natural circulation with the assistance of gravity, the evaporator 212 is placed at a level lower than either condenser 214, 216, to allow gravity to assist in returning the condensed primary cooling medium 202 (liquid 204) to the evaporator 212. Maintaining the primary cooling medium 202 in the liquid phase 204 throughout the entire length of the evaporator 212 is desirable. The height of the condensers 214, 216 above the evaporator are thus preferably high enough to provide sufficient pressure head from the primary cooling medium 202 in the liquid phase 204 to overcome the pressure drop of the evaporator 212. Although the evaporator 212 may be level with the liquid and vapor headers of the evaporator 212 lying in the same horizontal plane, the evaporator 212 may also be preferably inclined at an angle α from horizontal with the vapor header of the evaporator 212 higher than the liquid header to facilitate vapor expulsion. The passive condenser 214 may also be preferably inclined at an angle β from horizontal with the liquid header of the passive condenser 214 lower than the vapor header to facilitate condensate flow via gravity. The inclination angles (angles β) of the passive condenser is preferably sufficient to provide a clear drain path and eliminate back flow of the primary cooling medium 202 in the passive condenser 214.

Figure 5A:
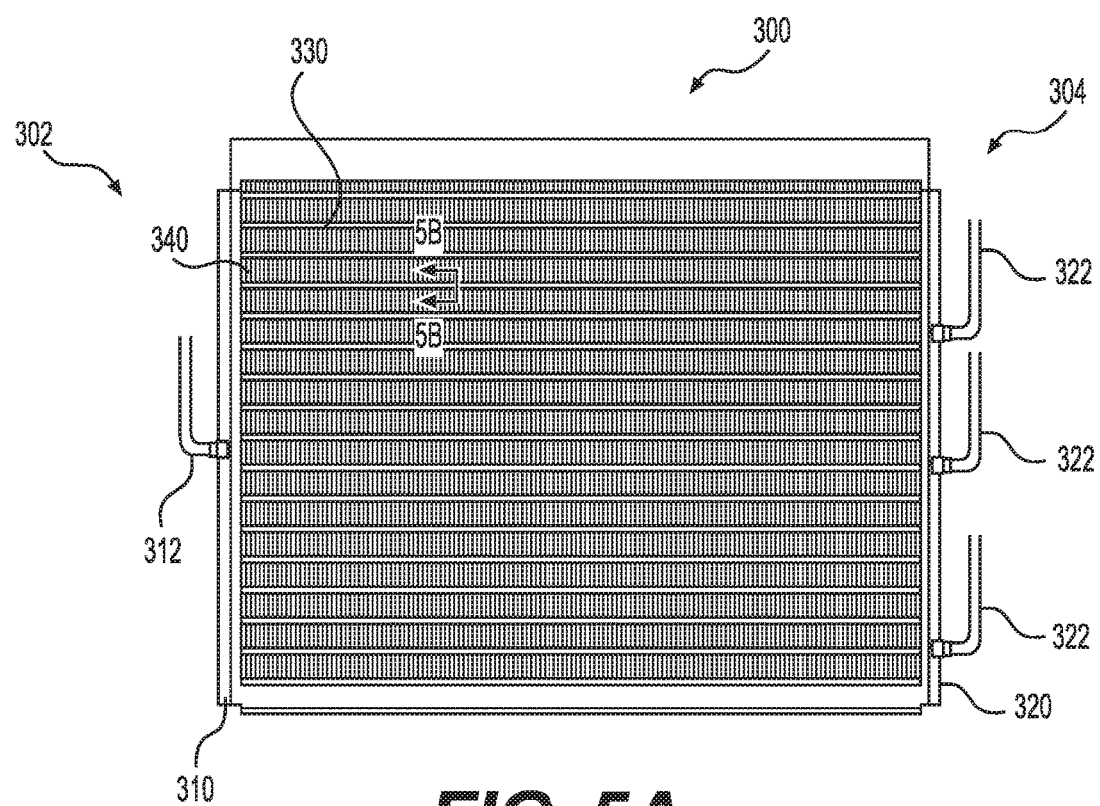
FIG. 5A shows a microchannel cooling coil that may be used in the airstream cooling assembly shown in FIG. 3.

As discussed above, the evaporator 212 and passive condenser 214 may be microchannel coils. FIG. 5A shows a microchannel coil 300 that may be used as the evaporator 212 and passive condenser 214 of this embodiment. Using a microchannel coil 300 has a number of advantages, including, for example, that the high internal surface area of the microchannel coil 300 aids in heat transfer. In addition, a microchannel coil 300 greatly reduces the volume of the primary cooling medium 202 needed in the primary coolant loop 210 as compared to, for example, finned tube coils. This reduction in primary cooling medium 202 volume is beneficial for a number of reasons including reduced costs and, when certain refrigerants are used, a reduced source of potential greenhouse gas emissions. The microchannel coil 300 has a liquid side 302 and a vapor side 304. As shown in FIG. 5A, when the microchannel coil 300 is used as an evaporator 212, the flow of the primary cooling medium 202 is from the liquid side 302 to the vapor side 304 (left to right), and when the microchannel coil 300 is used as a passive condenser 214, the flow is opposite (right to left).

Figure 5B:
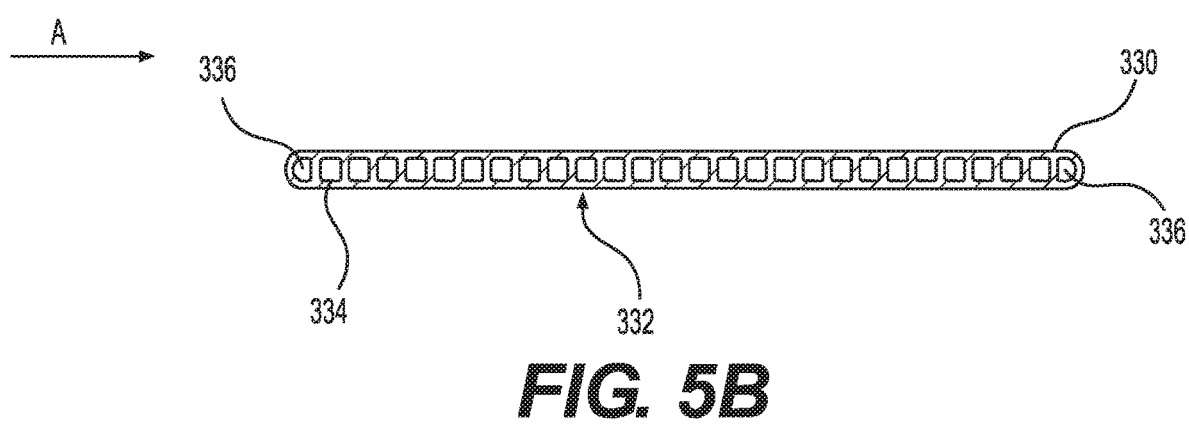
FIG. 5B is a cross-section view of a microchannel of the microchannel cooling coil shown in FIG. 5A taken along line 5B-5B in FIG. 5A.

The microchannel coil 300 has a liquid header 310 and a vapor header 320 that are connected by a plurality of microchannel extrusions 330. A cross-section, taken along line 5B-5B in FIG. 5A, of a microchannel extrusion is shown in FIG. 5B. The microchannel extrusions 330 have an outer surface 332 and include a plurality of microchannels 334, 336. An airstream is directed over the outer surface 332 of the microchannel extrusions 330 in direction A, shown in FIG. 5B (in and out of the page in FIG. 5A). The primary cooling medium 202 flows through the microchannels 334, 336. Each of the plurality of microchannel extrusions 330 are mechanically brazed to aluminum fins 340 positioned between the microchannel extrusions 330 to promote heat transfer.

The liquid header 310 includes a liquid connection 312 that connects the liquid header 310 to the liquid refrigerant line 224. Likewise, the vapor header 320 also includes at least one vapor connection 322 that connects the vapor header 320 to the vapor pipe 222. With a microchannel coil used as the evaporator 212, it may be beneficial to have multiple vapor connections 322. In this embodiment, three vapor connections 322 are shown. Using multiple vapor connections 322 reduces the back pressure of vapor in the vapor header 320 and promotes natural circulation flow in the primary coolant loop 210. When multiple vapor connections 322 are used for the evaporator 212, a corresponding number of vapor connections 322 may be used for both the passive and active condensers 214, 216, resulting in a plurality of vapor pipes 222 connecting the vapor connections 322. Another consideration for the vapor pipe 222 and the vapor connections 322 is to use large diameter pipes, decreasing back pressure of vapor and promoting natural circulation flow in the primary coolant loop 210. For example, when R410a is used as the primary cooling medium 202, the vapor pipes 222 may be sized to allow a velocity of the primary cooling medium 202 in the vapor phase 206 to be preferably less than 1,000 fpm and more preferably less than 600 fpm. These header design features are not limited to microchannel coils but may also apply to other evaporators and condensers including finned tube coils.

As discussed above, the cooling system 110 of this invention may include a plurality of airstream cooling assembly loops 200. For example, the cooling system 110 shown in FIGS. 1 and 2 has four airstream cooling assembly loops 200. In the following discussion of multiple loops, the same reference numerals are used as discussed above with reference to FIGS. 3 and 4, and letters are appended to the reference numerals to designate the different loops. For example, the letter "a" is appended to components of a first airstream cooling assembly loop 200a, the letter "b" is appended to components of a second airstream cooling assembly loop 200b, etc.

One pair of evaporators 212a, 212b is arranged in parallel with another pair of evaporators 212c, 212d relative to the return air 114 airstream. The evaporators 212a, 212b, 212c, 212d within each pair are arranged in series. In the first pair, return air 114 is directed across a first evaporator 212a of the pair before being directed across a second evaporator 212b of the pair. Likewise in the second pair, return air 114 is directed across a first evaporator 212c of the pair before being directed across a second evaporator 212d of the pair. The corresponding passive condensers 214a, 214b, 214c, 214d are similarly arranged in pairs (first pair 214a, 214b and second pair 214c, 214d) with the first pair being in parallel with the second pair and each condenser within the pair being arranged in series. In the first pair, scavenger air 118 is directed across the first condenser 214a of the pair before being directed across the second condenser 214b of the pair and, in the second pair, across the first condenser 214c of the pair before being directed across the second condenser 212d of the pair.

In one configuration of the cooling system 110 shown in FIGS. 1 and 2, the cooling system 110 may be enclosed with a footprint of 32 feet long (FIG. 1) and 10 feet, 2 inches wide (FIG. 2) with a total height (excluding the scavenger fans 120) of 12 feet, 8 inches. In this example, there is 88 ft$^2$ of coil area (evaporator 212) available for the cooling process. At a nominal 500 fpm through the evaporators 212, a design flow of 44,000 scfm and 348 kW is possible, resulting in a perimeter watt capacity of 107 kW/m. The coil length of the evaporator 212 can easily be extended to further increase the airflow and thus the capacity of the cooling system 110 without increasing its width, making even greater perimeter watt capacities possible.

Figure 6:
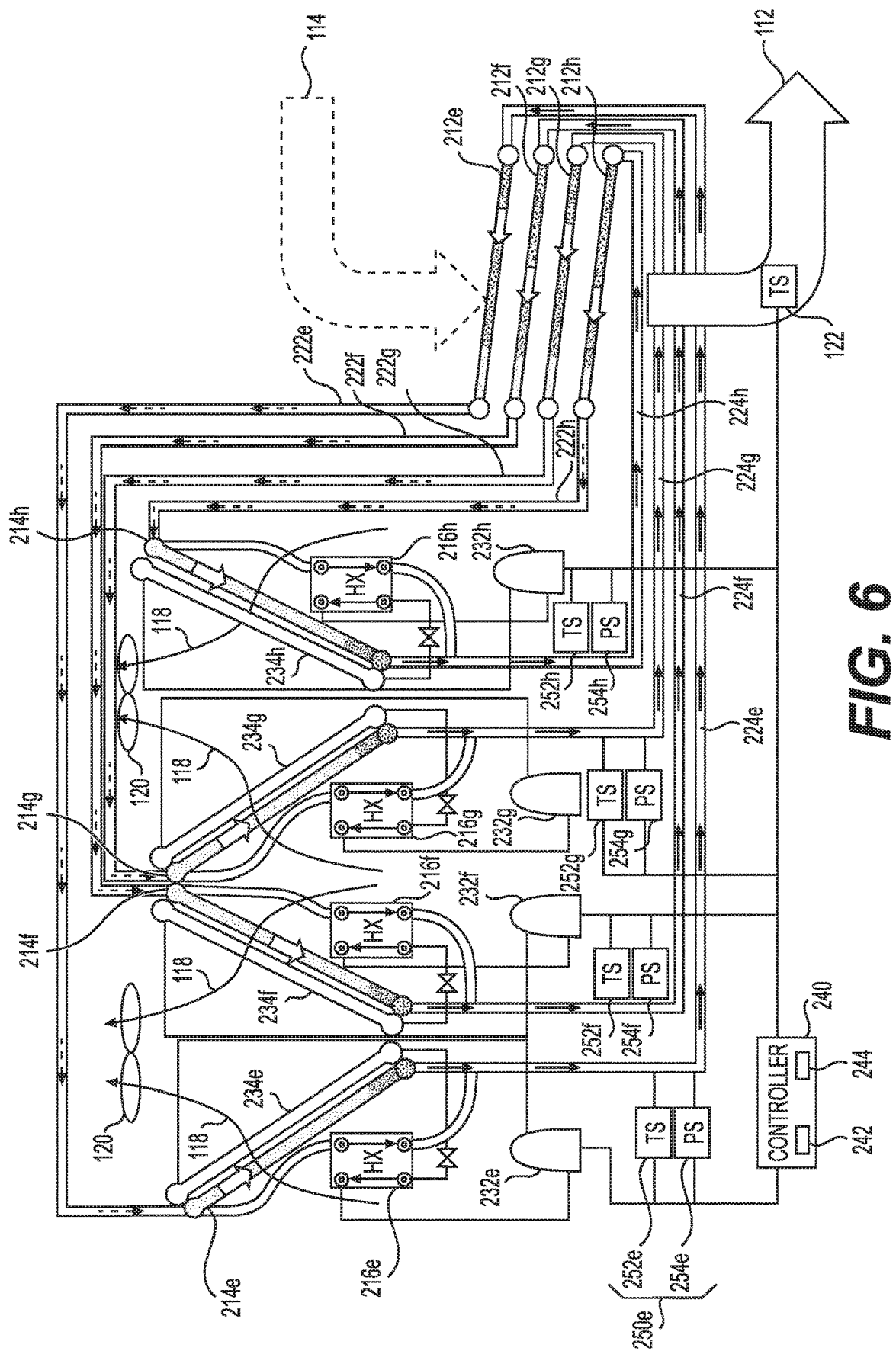
FIG. 6 is a schematic of a cooling system having multiple loops of the airstream cooling assembly shown in FIG. 3 operating in a passive mode.

Any number of suitable configurations for multiple airstream cooling assembly loops 200 may be used. For example, FIG. 6 is a schematic of another arrangement for the cooling system 110 having a plurality of airstream cooling assembly loops 200. In the configuration shown in FIG. 6, the cooling system 110 has four airstream cooling assembly loops 200. The evaporators 212e, 212f, 212g, 212h of each loop 200 are arranged in series with respect to the return air 114, but as discussed above the evaporators 212e, 212f, 212g, 212h may also be arranged in parallel. The return air is first directed over the evaporator 212e of the first loop before being subsequently directed over the evaporator 212f of the second loop, the evaporator 212g of the third loop, and the evaporator 212h of the fourth loop, in that order. In the configuration shown in FIG. 6, all four passive condensers 214e, 214f, 214g, 214h are arranged in parallel with respect to the scavenger air 118, but as discussed above the passive condensers 214e, 214f, 214g, 214h may also be arranged in series. Each condenser 234e, 234f, 234g, 234h for the secondary cooling system 230 (which in this embodiment is a direct expansion cooling system) is arranged in series, relative to the scavenger air 118, with the passive condenser 214e, 214f, 214g, 214h of the corresponding loop.

In general, the internal temperature of each airstream cooling assembly loop 200 will be isothermal, but each of the four airstream cooling assembly loops 200 will operate at a different temperature and pressure. The temperature of the primary cooling medium 202 in the first loop will be the warmest as air entering the evaporator 212e of the first loop will be the warmest (the initial temperature of the return air 114). The air entering the evaporators 212f, 212g, 212h becomes subsequently cooler than that in the previous loop because of the cooling resulting from the previous loop. When the ambient air temperature is lower than the temperature of each of the airstream cooling assembly loops 200, the energy in the primary cooling medium can be transferred from the return air 114 to the scavenger air 118 in the passive mode with all four loops operating in passive mode as shown in FIG. 6.

Figure 7:
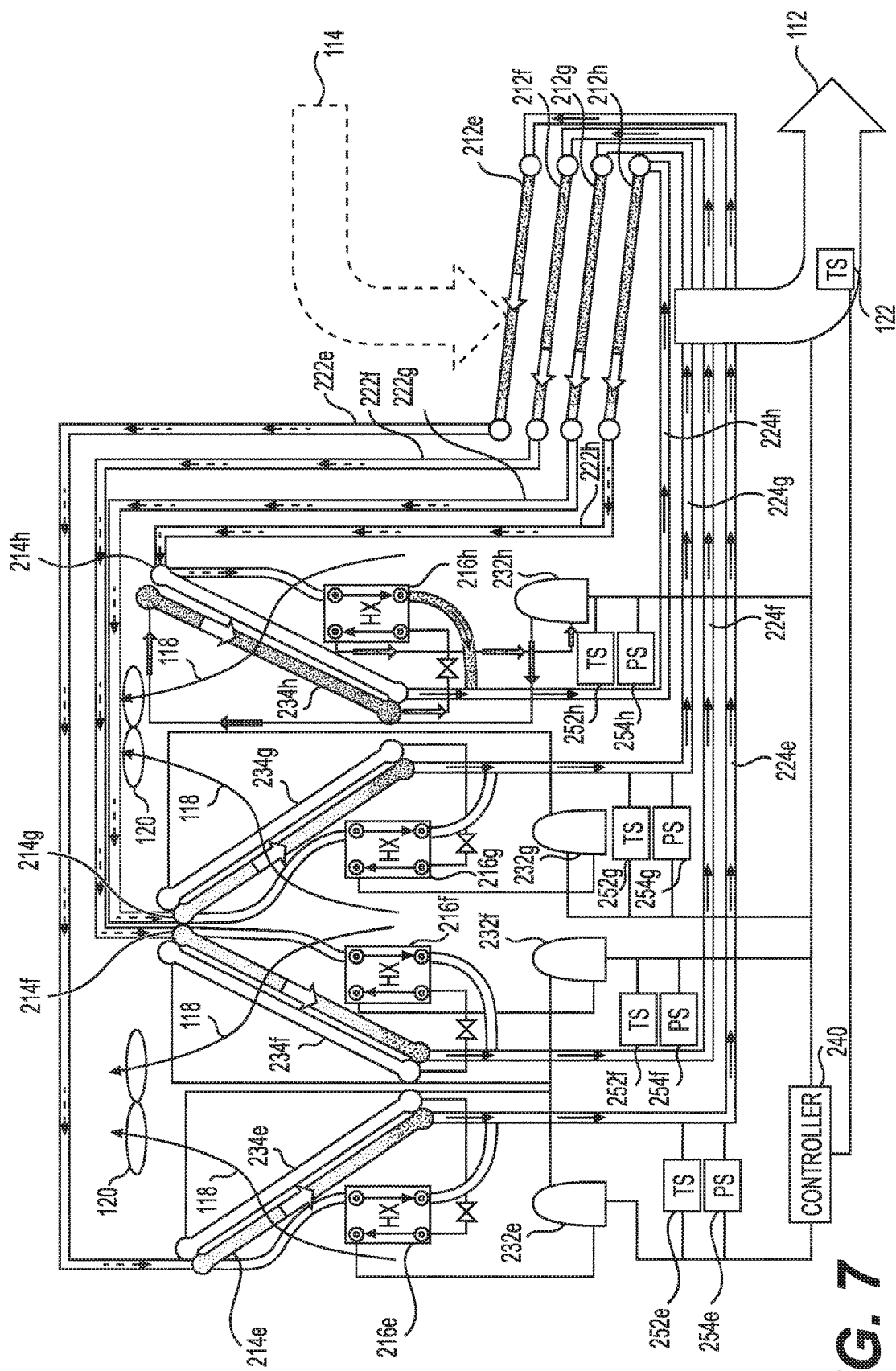
FIG. 7 is a schematic of the cooling system shown in FIG. 6 with one of the airstream cooling assembly loops operating in an active mode.
Figure 8:
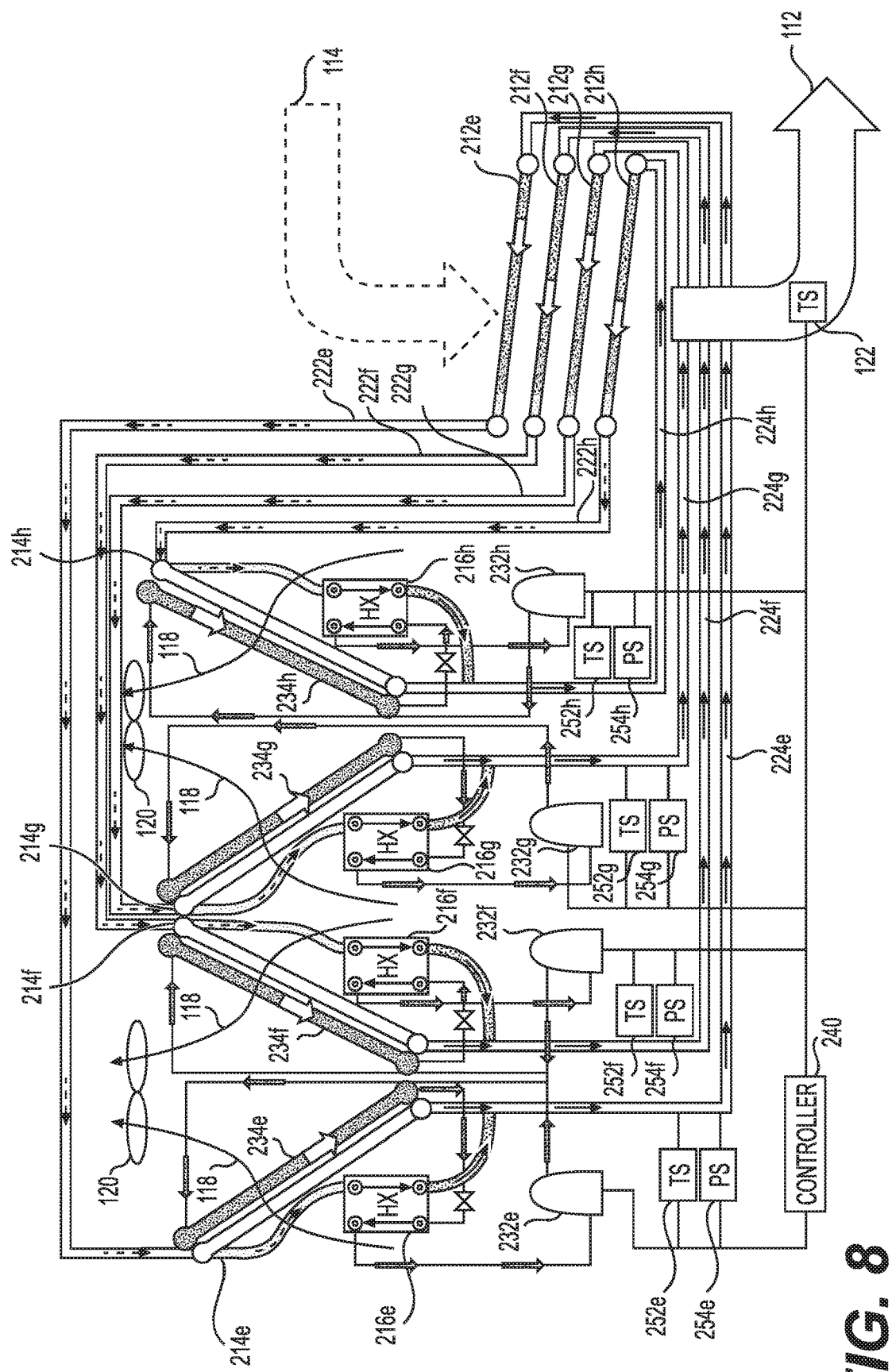
FIG. 8 is a schematic of the cooling system shown in FIG. 6 with all of the airstream cooling assembly loops operating in an active mode.

Each loop can be selectively operated in either the passive or active mode. FIG. 7 shows the cooling system 110 operating with the fourth loop in active mode and the other three loops operating in passive mode, and FIG. 8 shows all four loops operating in active mode. A controller 240 may be used to operate the cooling system 110. In this embodiment, the controller 240 is a microprocessor-based controller that includes a processor 242 for performing various functions discussed further below and a memory 244 for storing various data. The controller 240 may also be referred to as a CPU. In one embodiment, control of the cooling system 110 may be implemented by way of a series of instructions stored in the memory 244 and executed by the processor 242.

The controller 240 is communicatively coupled to a temperature sensor ("TS") 122. In this embodiment, the temperature sensor 122 is used to monitor the temperature of the supply air 112, allowing the temperature sensor 122 to transmit (and the controller 240 to receive) the temperature of the supply air 112. Loop sensors 250 may also be used to measure various parameters of each airstream cooling assembly loop 200. For example, the loop sensors 250 may measure the temperature and pressure of the primary cooling medium 202 in each loop using a temperature sensor ("TS") 252 and a pressure sensor ("PS") 254, respectively. Preferably the temperature and pressure sensors 252, 254 are located in the liquid refrigerant line 224 to monitor the temperature and pressure of the liquid 204 phase of the primary cooling medium 202.

The controller 240 may also be communicatively coupled to other components of the cooling system 110 and used to control those components as well. For example, the supply air fans 116 and the scavenger air fans 120 may be communicatively coupled to the controller 240, and thus the controller 240 may be used to direct the return air 114 and scavenger air 118 over the evaporators 212e, 212f, 212g, 212h and condensers 214e, 214f, 214g, 214h, respectively, and increase or decrease the airflow. The controller 240 may also be communicatively coupled to the secondary cooling system 230e, 230f, 230g, 230h of each loop and used to turn on or off (activate or deactivate) the secondary cooling system 230e, 230f, 230g, 230h.

Figure 9:
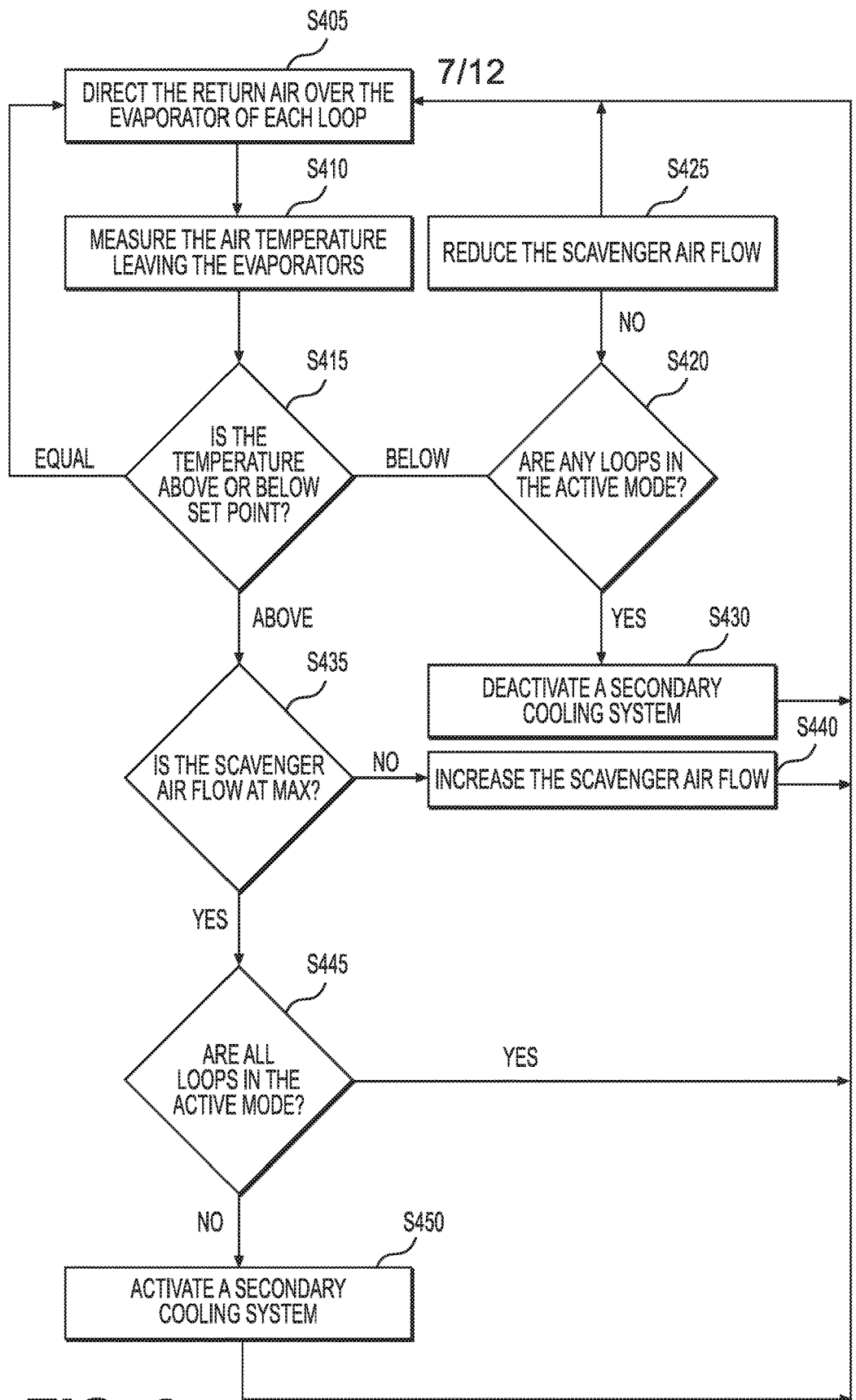
FIG. 9 is a flow chart depicting a method of operating the cooling system shown in FIG. 4.

FIG. 9 is a flow chart showing one example of how the cooling system 110 shown in FIGS. 6 and 7 may be controlled. In step S405, the controller 240 directs the return air 114 over the evaporators 212e, 212f, 212g, 212h. The supply air temperature sensor 122 is used to measure the temperature of the supply air 112, and the controller 240 receives the temperature of the supply air 112 in step S410. The controller 240 then compares the measured temperature of the supply air 112 with a set point in step S415. The set point may be provided to the controller 240 using any suitable method or device. For example, the controller 240 may be communicatively coupled to a user interface through which a user can provide a desired temperature of the supply air 112, and the controller 240 can receive the desired temperature of the supply air 112 to use as the set point. If the temperature of the supply air 112 is equal to the set point (or within a suitable operating range of the set point), the control system 240 returns to step S405 to continue monitoring the temperature of the supply air 112.

If the temperature of the supply air 112 is too cold (below the temperature of the set point or operating range), the controller 240 checks, in step S420, to see if any of the loops 200 are operating in the active mode. The controller 240 may store, for example, the mode of a loop in the memory 244 when the controller activates or deactivates the secondary cooling system 230 for that loop. The controller 240 may then query the memory 244 to determine the mode of any loop. The controller 240 may store in the memory 244 other suitable parameters, such as the flow rate of the scavenger air 118 (e.g., speed and number of scavenger fans 120 running) for example, the controller 240 may likewise check and alter these parameters in a similar manner. If the controller 240 determines (in step S420) that no loops 200 are in the active mode, the controller 240 reduces the airflow of the scavenger air 118 in step S425 before returning to step S405 to continue monitoring the temperature of the supply air 112. If any changes to the cooling system 110 are made in step S425 (or any other step discussed herein), the controller 240 may delay monitoring the temperature of the supply air 112 to allow the change to impact the temperature of supply air 112.

If the controller 240 determines, in step S420, that at least one loop 200 is in the active mode, the controller 240 deactivates the secondary cooling system 230 in one of the loops 200, in step S430. As shown in FIG. 7 for example, the fourth loop is operating in the active mode. If the temperature of the supply air is too cold in this configuration, the controller 240 would deactivate the secondary cooling system 230h of the fourth loop, returning the fourth loop to the passive mode, as shown in FIG. 6. Preferably, the controller 240 will deactivate the secondary cooling system 230 of the loop operating in the active mode which has its evaporator 212 the farthest upstream relative to the return air 114. The controller 240 then returns to step S405 to continue monitoring the temperature of supply air 112.

If the temperature of the supply air 112 is too hot (above the temperature of the set point or operating range), the controller 240 first checks, in step S435, to see if the airflow of the scavenger air 118 can be increased. If the airflow of the scavenger air 118 can be increased (the airflow the scavenger air 118 is not at its maximum), the controller 240 increases the airflow of the scavenger air 118 in step S440 before returning to step S405. The controller 240 may increase the airflow of the scavenger air 118 by any suitable means including, for example, by increasing the speed of the scavenger air fans 120. If the airflow of the scavenger air 118 cannot be increased (the airflow of the scavenger air 118 is at its maximum), the controller 240 checks, in step S445, to see if all the loops 200 are in the active mode. If all of the loops 200 are in the active mode, as shown in FIG. 8, the cooling system 110 is operating at its maximum cooling capacity and the controller 240 returns to step S405. If at least one loop is in the passive mode, the controller 240 will activate a secondary cooling system 230 for one of the loops 200 in step S450. For example, if all of the loops are operating in the passive mode as shown in FIG. 6, the controller 240 will activate the secondary cooling system 230 of one of the loops 200, such as the secondary cooling system 230h of the fourth loop. Preferably, the controller 240 will activate the secondary cooling system 230 of the loop operating in the passive mode which has its evaporator 212 the farthest downstream relative to the return air 114. The controller 240 then returns to step S405 to continue monitoring the temperature of supply air 112.

For data center cooling systems, it is often desirable to have efficiencies of 65% or greater in an economizer mode (passive mode in this embodiment). In the passive mode, the refrigerant is at virtually the same pressure at all locations within the primary coolant loop 210, and the internal temperature is isothermal. Based on energy balance requirements, if the passive condenser 214 and the evaporator 212 heat transfer constraints are the same (equal air flows over the outer surface of the condenser 214 and evaporator 212 and surface characteristics of the outer surface of the condenser 214 and evaporator 212), the refrigerant would exist at a temperature equal to the average of the evaporator 212 and the passive condenser 214 inlets, and, in a non-ideal world, the net efficiency of a single loop 200 would be less than 50%. A heat exchange efficiency, when measured on the evaporator size of greater than 50%, is achievable, however, with unbalanced airflows over the outer surface of the condenser 214 and evaporator 212.

Using multiple loops 200 with air counterflow to the flow in the primary coolant loop 210, the efficiencies of each loop will have additive effect and efficiencies greater than single loop efficiencies can be achieved. For example, if two loops 200, each having an efficiency of 50%, are used with the scavenger air 118 flowing in series through the first loop and then the second loop and the return air 114 flowing in the opposite direction (through the second loop and then the first loop) an efficiency greater than 70% can be achieved. If, however, the efficiency for a single loop 200 drops to 39%, three loops 200, rather than two, can be positioned in counterflow to achieve a net efficiency greater than 70%. The calculations above used scavenger air 118 having a temperature of 70° F. delivered at 10,000 cfm and return air 114 having a temperature of 100° F. delivered at 5,000 cfm.

The following examples (Cases 1 through 6) were constructed to evaluate the efficiency of a single loop 200. The results of these evaluations are presented in Table 1 below. The following cases used an unbalanced airflow where the scavenger fan 120 was selected to provide at least a 2:1 airflow ratio of scavenger air 118 to return air 114 based on a nominal 500 fpm face velocity of the return air 114 over the evaporator 212. In the following experimental cases, however, a flow ratio closer to 2.2:1 was achieved with the total airflow across the evaporator 212 being 5,000 scfm and the total airflow across the passive condenser 214 being 11,000 scfm. The face velocity across the passive condenser 214 was 500 fpm.

The first case (Case 1) used finned tube ("FT") coils for both the evaporator 212 and passive condenser 214. The coil for the evaporator 212 was a flooded, two-row, one-pass coil, and the coil for the passive condenser 214 was a three-row, one-pass coil. Both coils used half-inch tubes in a typical tube arrangement and had 10 fins per inch. Each coil was 5 ft. long. Both the evaporator 212 and the passive condenser 214 were mounted at a 15 degree angle relative to horizontal to facilitate vapor expulsion and condensate flow via gravity. The passive condenser 214 was mounted with its lower end 2 feet above the upper discharge of the evaporator 212. Vapor and liquid lines between the coils were oversized, using a 1⅛ inch pipe for the liquid refrigerant line 224 and a 2⅛ pipe for the vapor pipe 222, so as not to inhibit refrigerant flow and affect the resultant performance. R410a was used as the refrigerant.

The second case (Case 2) was the same as the first case, but a flooded microchannel coil (MC) was used as the evaporator 212 instead of a finned tube coil. Using a microchannel coil significantly reduced the refrigerant charge needed because the internal volume of the microchannel coil was greatly reduced (by over 47%) compared to the half-inch tube coil. Each microchannel extrusion 330 had a width of 38 mm with 28 microchannels 334, 336. The width of each of the 26 internal microchannels 334 was 0.92 mm and the outer two microchannels 336 (see FIG. 5B) was rounded with a 0.55 mm radius and had an overall width of 0.94 mm. The microchannel extrusion 330 had an overall height of 1.8 mm with an external wall thickness t of 0.35 mm. The internal wall thickness separating the microchannels 334 was 0.40 mm. Sixty-seven microchannel extrusions 330 were used and each had a length of 1.57 m. A single liquid connection 312 with an outside diameter of 22.2 mm was used and a single vapor connection 322 with an outside diameter of 25 mm was used.

The third case (Case 3) was the same as the second case, but a microchannel coil (MC) was used as the passive condenser 214 instead of a finned tube coil. The microchannel coil for the passive condenser 214 was designed similarly to the microchannel coil for the evaporator 212 (described above in Case 2), but the passive condenser 214 used 100 microchannel extrusions 330, each having a length of 1.57 m.

The fourth case (Case 4) was the same as the third case, but three vapor pipes 222 and vapor connections 322 were used instead of one (MC Mod). The configuration of the loops 200 in Cases 3 and 4 was also evaluated with a higher temperature differential between the evaporator 212 and the passive condenser 214 (Cases 5 and 6, respectively). The temperature differential between the evaporator 212 and passive condenser 214 in Cases 5 and 6 was increased by increasing the temperature of the return air 114 by 20° F. to 25° F., relative to Cases 3 and 4. Table 1 below presents the results of each of the cases and in the table "Evap" refers to the evaporator 212 and "Cond" refers to the passive condenser 214.

TABLE 1

| Case | Coil Type | | Temperature (° F.) | | Efficiency (%) | Power (kW) |
| --- | --- | --- | --- | --- | --- | --- |
| | Evap | Cond | Evap | Cond | | |
| 1 | FT | FT | 95.1 | 67.8 | 34 | 14.8 |
| 2 | MC | FT | 95.0 | 67.1 | 57 | 25.3 |
| 3 | MC | MC | 95.0 | 73.7 | 57 | 19.3 |
| 4 | MC Mod | MC Mod | 100.5 | 67.9 | 60 | 31.0 |
| 5 | MC | MC | 120.0 | 81.7 | 31 | 18.9 |
| 6 | MC Mod | MC Mod | 122.3 | 68.4 | 55 | 47.0 |

As can be seen in Table 1 above by comparing Case 1 to Case 2, using a microchannel coil instead of a finned tube coil in the evaporator 212 made the most significant difference to performance, increasing heat exchange efficiency to from 34% to 57%. Changing the passive condenser 214 to a microchannel coil had little effect on the performance results at normal conditions (compare Case 2 with Case 3). Modifying the evaporator 212 and passive condenser 214 to have additional vapor connections 322 resulted in a 3% efficiency gain at normal conditions (compare Case 3 with Case 4). When the temperature difference between the evaporator 212 and passive condenser 214 was increased, the efficiency dropped (compare Cases 3 and 4 with Cases 5 and 6, respectively), but having multiple vapor connections 322 resulted in a smaller efficiency drop and the total power transfer increased greatly to nearly 50 kW.

Using the properties of R410a and a known heat transfer rate, a mass flow of primary cooling medium 202 may be calculated based on the specific heats of the vapor and liquid. In the case of the microchannel evaporator 212, the limit to heat flux was in the range of 20 kW. Using an enthalpy difference between liquid and vapor for R410a, a mass flow of 387 kg/hr and flow rate of 5.88 m³/hr are calculated. Applying the inside diameter of a single ⅞ inch tube, the velocity of the gas is 4.2 m/s. Adding two additional vapor connections to the coil increases the capacity 50 kW and results in a velocity of 3.1 m/s. So for practical purposes, when using R410a, piping connections are preferably sized for a maximum velocity under about 4 m/s. The vapor flow rate inside the microchannel extrusions 330 is 2.1 m/s for the heat exchange rate of 50 kW. The sizing will vary for other refrigerants based on their density and viscosity but can be determined experimentally.

A plate heat exchanger was used as the active condenser 216 in each of Cases 1 through 6. The active condenser 216 was arranged in parallel with the passive condenser 214, and chilled water was used as the secondary cooling medium 208. In the active mode, the efficiency data and maximum power data closely mimicked the air to air data, confirming the superiority of the microchannel evaporator 212 to the finned, tube evaporator 212 and the increase in total capacity after the addition of the extra header connections to the microchannel for the vapor transport.

Figure 10:
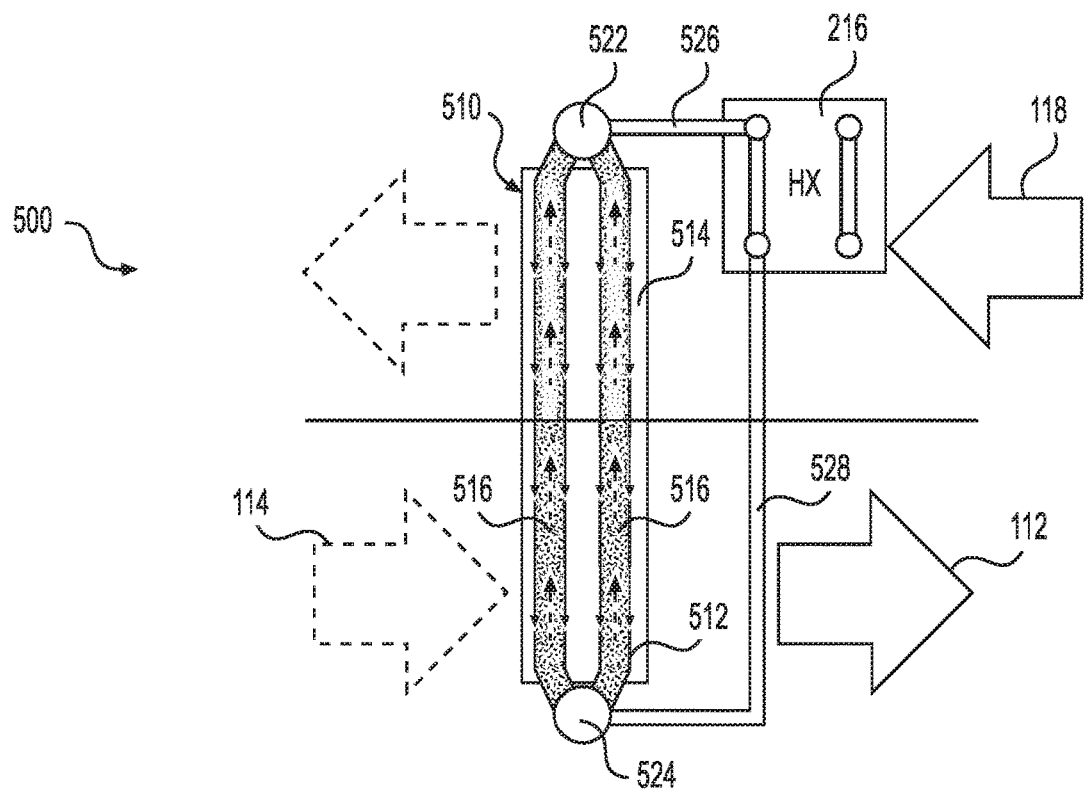
FIG. 10 is a schematic of an airstream cooling assembly according to a second preferred embodiment of the invention operating in a passive mode.
Figure 11:
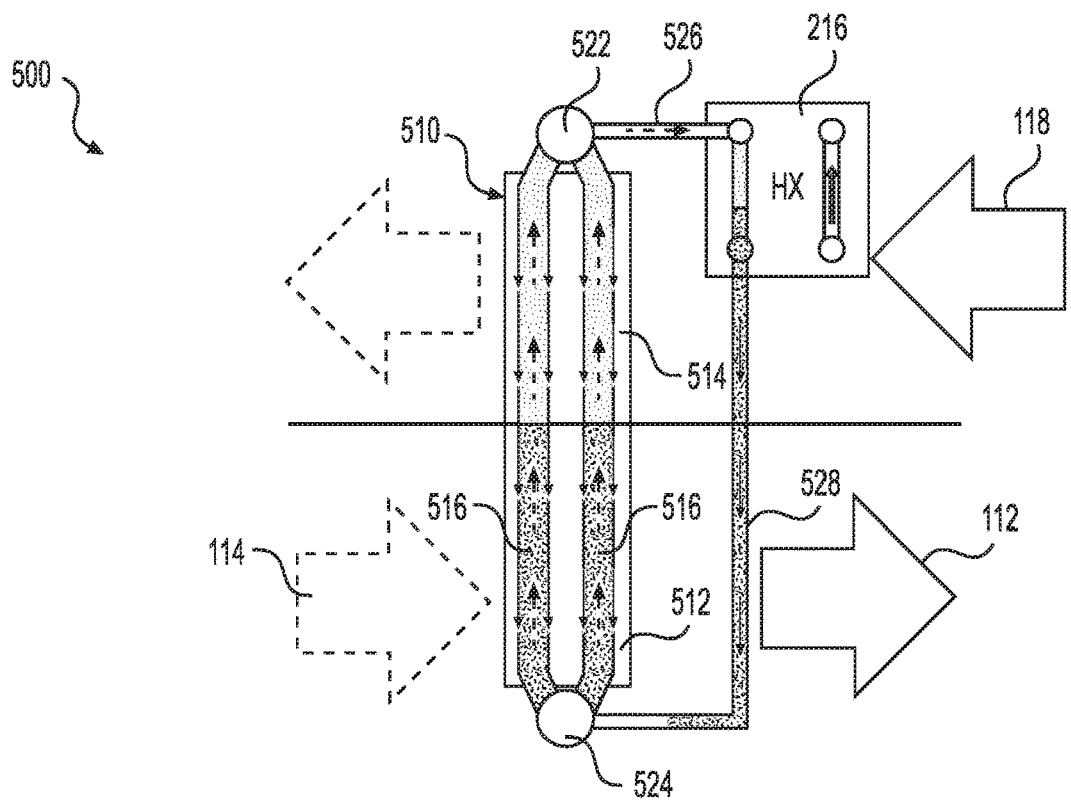
FIG. 11 is a schematic of the airstream cooling assembly shown in FIG. 10 operating in an active mode.

A second preferred embodiment of an airstream cooling assembly loop 500 is shown in FIGS. 10 and 11. In this embodiment, the evaporator 512 and the passive condenser 514 are incorporated in an integral heat exchanger 510, which operates as a heat pipe. The evaporator 512 is a lower portion of the integral heat exchanger 510 and may also be referred to as an evaporator portion 512. Likewise, the passive condenser 514 is an upper portion of the integral heat exchanger 510 and may also be referred to as a condenser portion. As with the first embodiment, any suitable heat exchanger may be used, including finned tube coils or microchannel coils. In this embodiment, the integral heat exchanger 510 is shown as a finned tube coil with tubes 516 connecting two fixed headers, a top header 522 and a bottom header 524. As will be described below, gravity also plays a role in the cooling process and as a result, the tubes 516 are oriented preferably upright and more preferably, vertically.

The airstream cooling assembly 500 operating in passive mode is shown in FIG. 10. The hot return air 114 is directed over the evaporator portion 512 of the integral heat exchanger 510. The primary cooling medium 202, which is contained within the tubes 516, changes from the liquid phase 204 to the gas phase 206, drawing heat from the return air 114 and, as a result, cooling the return air 114. As the primary cooling medium 202 evaporates, the vapor 206 rises in the tube 516 to the condenser portion 514 of the heat exchanger. In the passive mode, scavenger air 118 is directed over the condenser portion 514. Heat is rejected from the primary cooling medium 202 to the scavenger air 118, condensing the primary cooling medium from the gas phase 206 to the liquid phase 204. The liquid 204 of the primary cooling medium 202 then wicks down the sides of the tube 516, assisted by gravity, back to the evaporator portion 512.

The airstream cooling assembly 500 operating in active mode is shown in FIG. 11. As with the airstream cooling assembly 200 of the first embodiment, the evaporator 512 of the airstream cooling assembly 500 is also connected to a second condenser, an active heat exchanger condenser 216. A vapor pipe 526 connects the top header 522 of the integral heat exchanger 510 with the active condenser 216. The vapor 206 of the primary cooling medium 202 travels through the vapor pipe 526 to the active condenser 216. As in the first embodiment, heat is rejected from the primary cooling medium 202 to the secondary cooling medium 208 of the secondary cooling system 230 at the active condenser, causing the primary cooling medium 202 to change phase from vapor 206 to a liquid 204. The condensed liquid 204 then travels, with the assistance of gravity, through a liquid refrigerant line 528 to the bottom header 524, establishing a recirculated refrigerant flow.

Also like the first embodiment, the airstream cooling assembly 500 of this embodiment operates without the need of pumps, oils, compressors, or even valves to switch between modes. Instead, by activating the secondary cooling system 230 to cool the active condenser 216, the vapor 206 of the primary cooling medium 202 naturally travels to the colder active condenser 216 to condense, and the airstream cooling assembly 500 automatically switches from passive mode to active mode. In addition, a controller 240, which may be communicatively coupled to temperature sensors 122, 252, may be used to control the airstream cooling assembly 500 of this embodiment.

Figure 12:
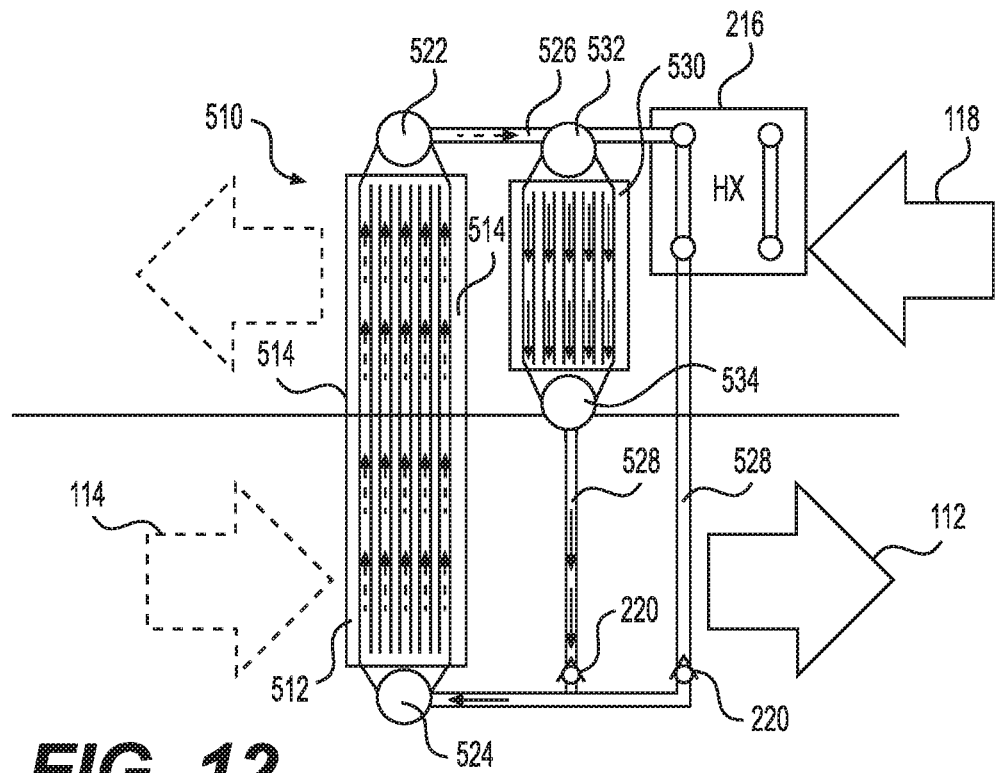
FIG. 12 is a schematic of an alternate configuration of the airstream cooling assembly of the second embodiment operating in a passive mode.
Figure 13:
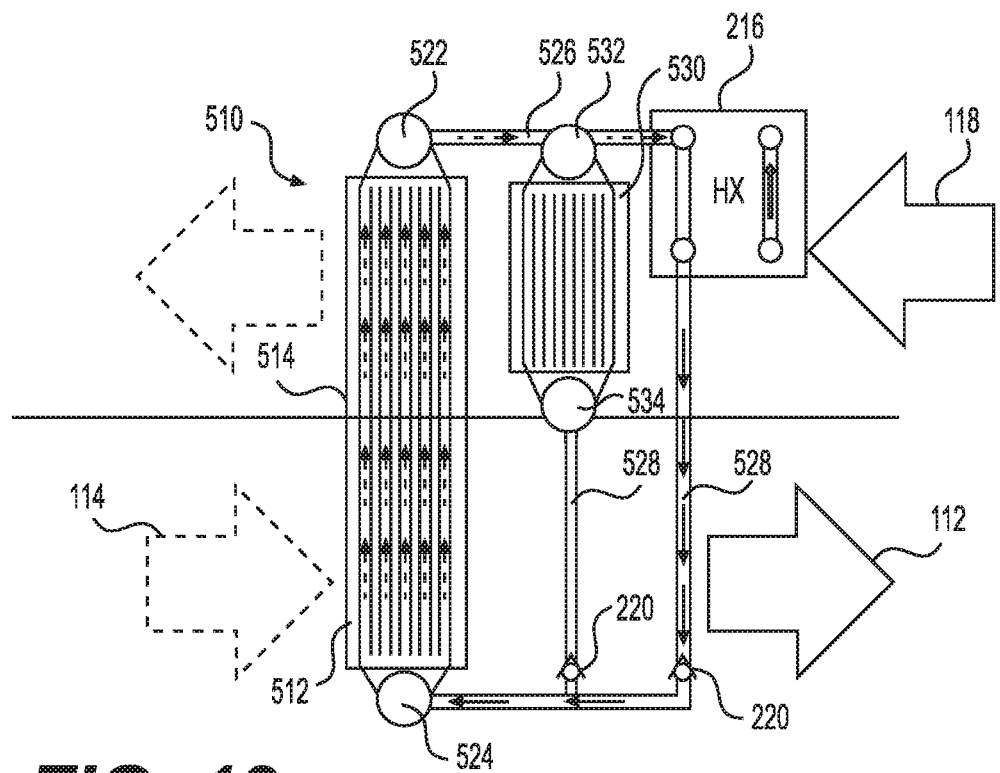
FIG. 13 is a schematic of the airstream cooling assembly shown in FIG. 12 operating in an active mode.

As discussed above, instead of a finned tube coil being used for the integral heat exchanger 510 a microchannel coil may be used. However, the total heat flux available may be limited in a passive mode that depends on heat pipe operation alone as the condensed liquid and evaporated gas flow counter to each other in the small channels of the microchannel extrusion. FIGS. 12 and 13 show another configuration of the second embodiment that includes a second passive condenser 530 (third condenser). In this embodiment, the third condenser 530 is a microchannel coil positioned in series, relative to the scavenger air 118, with the condenser portion 514 of the integral heat exchanger 510. Preferably, the third condenser 530 is positioned on the upstream side of the condenser portion 514 of the integral heat exchanger. The third condenser 530 has a vapor header 532 and a liquid header 534. The vapor header 532 of the third condenser is connected to the top header 522 of the integral heat exchanger 510 by the vapor pipe 526.

In the passive mode (shown in FIG. 12), the vapor 206 of the primary cooling medium 202 will flow through the vapor pipe 526 and into the third heat exchanger, where most of the condensation of the primary cooling medium 202 will occur. As with the passive condenser 214 of the first embodiment, scavenger air 118 is driven across an outer surface of the third condenser 530, and the heat of the primary cooling medium 202 contained in the third condenser 530 is released to the scavenger air 118, condensing the vapor 206 to a liquid 204. The liquid 204 of the primary cooling medium 202 then travels, with the assistance of gravity, through a liquid refrigerant line 528 to the bottom header 524 as a recirculated refrigerant flow.

In the active mode (shown in FIG. 13), the vapor 206 naturally flows to the colder active condenser 216 to be condensed, as discussed above, and there is minimal, if any, flow of the primary cooling medium 202 through the third condenser 530 in the active mode. As with the first embodiment, it may be beneficial to include vapor traps (not shown) and/or check valves 220 in the liquid refrigerant lines 528 to avoid reverse flow of the primary cooling medium 202 through the condenser 216, 530 that is not currently operating in a given mode.

Figure 14:
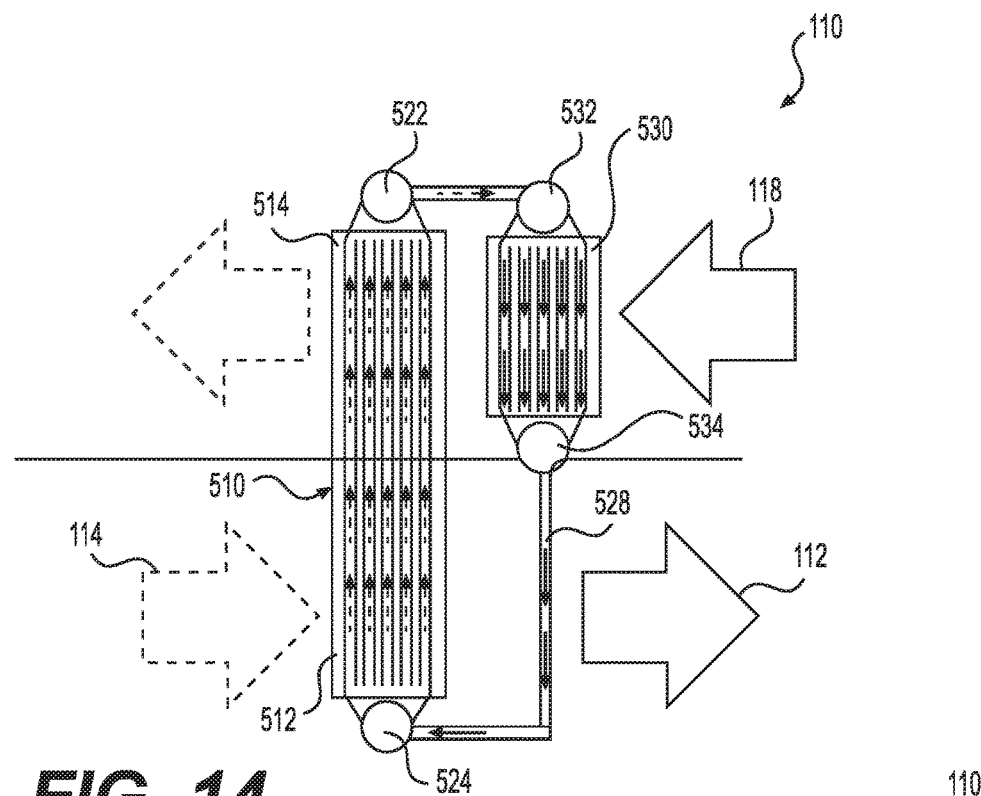
FIG. 14 is a schematic of another configuration of the airstream cooling assembly shown in FIG. 12.

The second passive condenser 530 may also be used in a configuration without the active condenser 216, as shown in FIG. 14. The configuration only has a passive mode, but the evaporator 512 is still connected to two condensers, the condensing portion 514 of the integral heat exchanger 510 and the second passive condenser 530.

Figure 15:
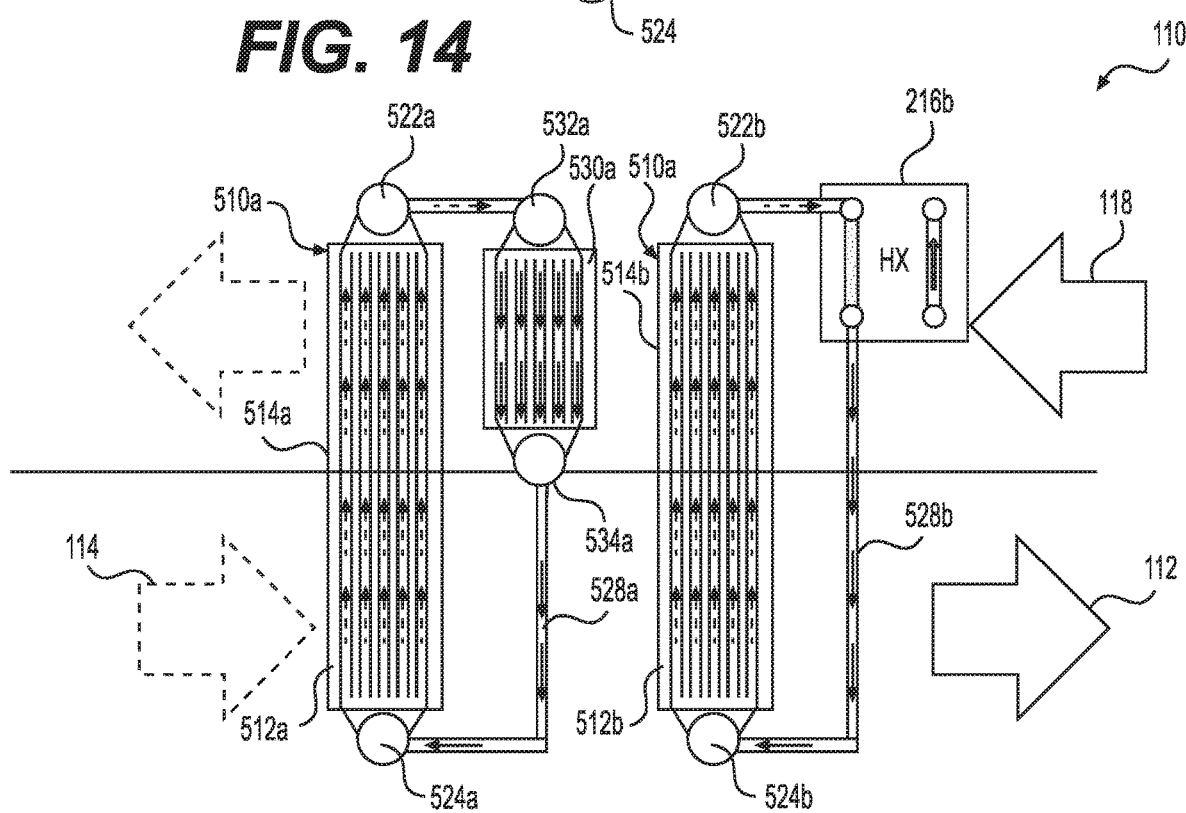
FIG. 15 is a schematic of a cooling system having a loop of the airstream cooling assembly shown in FIGS. 10 and 11 and a loop of the airstream cooling assembly shown in FIG. 14.

As with the airstream cooling assembly 200 of the first embodiment, the cooling system 110 may include a plurality of airstream cooling assemblies 500 of the second embodiment. For example, a cooling system 110 may include two loops 500a, 500b as shown in FIG. 15. The first loop 500a is similar to the configuration shown in FIG. 14 without an active condenser 216, and the second loop 500b is similar to the configuration shown in FIGS. 10 and 11, but with a microchannel coil for the integral heat exchanger 510b. In this configuration, the two evaporators 512a, 512b are arranged in series with respect to the return air 114. The integral heat exchanger 510b of the second loop 500b (having the active condenser 216) is located upstream of the integral heat exchanger 510a of the first loop 500a.

Figure 16:
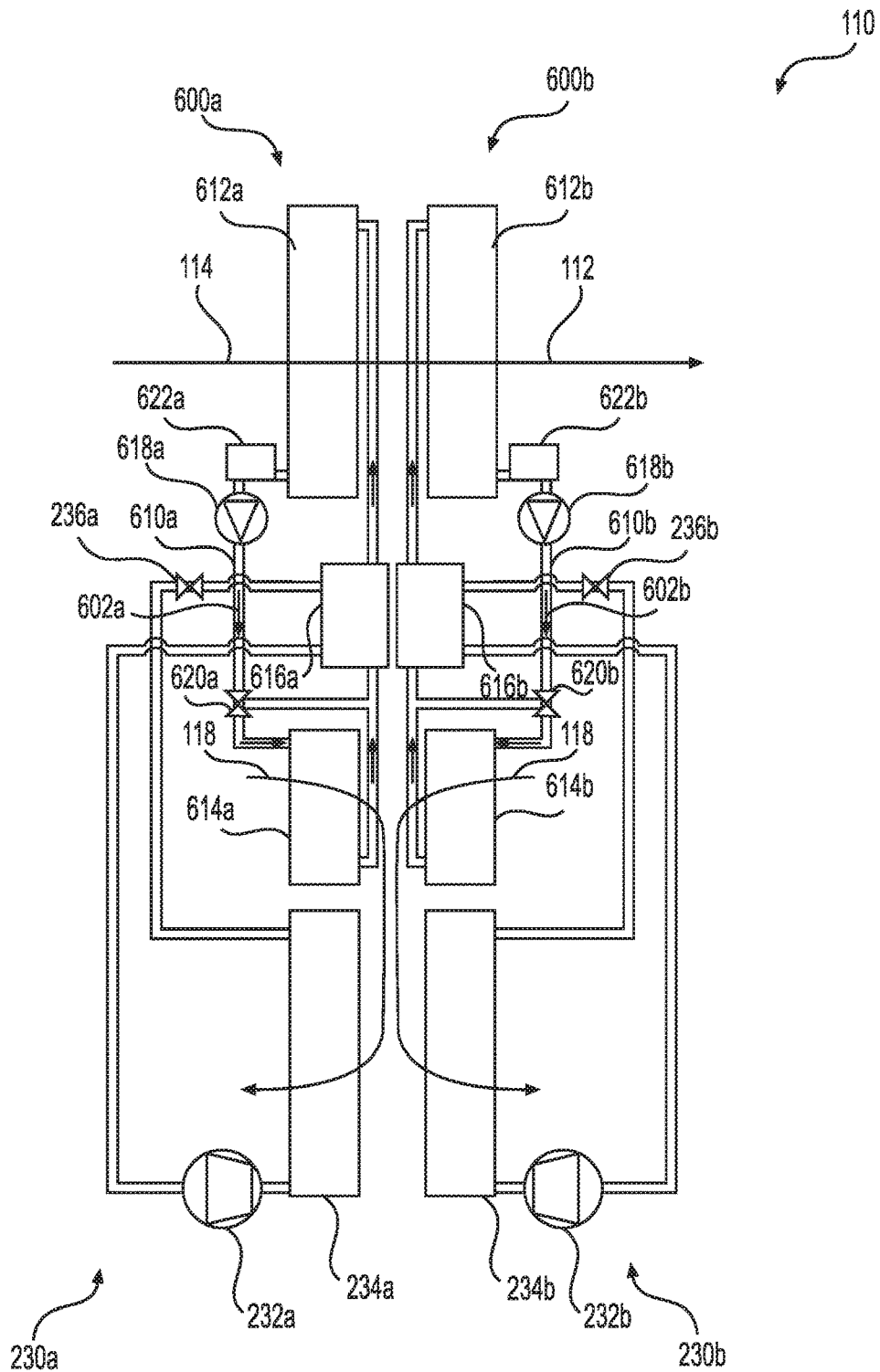
FIG. 16 is a schematic of another cooling system operating in a near passive mode.
Figure 17:
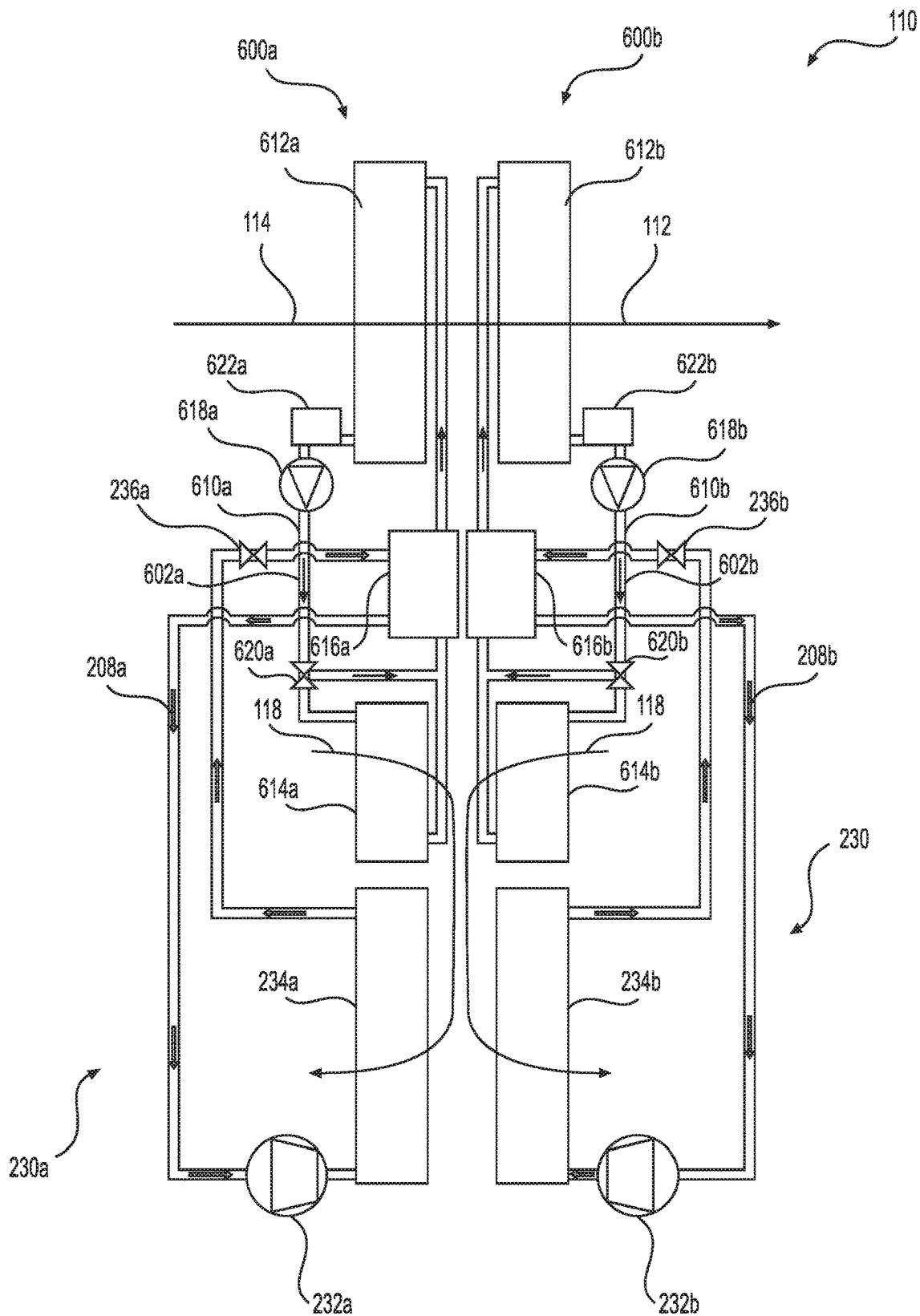
FIG. 17 is a schematic of the cooling system shown in FIG. 16 operating in an active mode.

Another cooling system 110 is shown in FIGS. 16 and 17 having two airstream cooling assembly loops 600, a first airstream cooling assembly loop 600a and a second airstream cooling assembly loop 600b, although any number of loops may be used, including a single loop. As with the discussion above, a letter is appended to a reference numeral to designate the loop in which the component is located. In this cooling system 110, the return air 114 is directed across two cooling coils 612a, 612b that are arranged in parallel with respect to the return air 114, although the cooling coils 612a, 612b may also be arranged in parallel. As the return air 114 flows across the cooling coil 612, heat is transferred from the return air to a primary cooling medium 602 contained within a primary coolant loop 610, heating the primary cooling medium 602. Any suitable primary cooling medium 602 may be used including, for example, water or mixtures of water and glycol.

The heat absorbed by the primary cooling medium 602 is subsequently rejected at either a second coil 614 in an economizer mode or a heat exchanger 616 in an active mode. The primary cooling medium 602 is circulated through the primary coolant loop 610 and to either the second coil 614 or the heat exchanger 616 by a pump 618. A diverter valve 620 selectively directs the pumped primary cooling medium 602 to either the second coil 614 or the heat exchanger 616, depending upon the mode.

FIG. 16 shows the cooling system 110 in the economizer mode. The economizer mode is used, as with the passive modes discussed in the embodiments above, when the ambient air temperature is less than the temperature of the primary cooling medium 602 after it has absorbed the heat from the return air 114 (e.g., measured at a point in the primary coolant loop 610 after the cooling coil 612). As with the embodiments discussed above, a predetermined temperature differential may be imposed to determine when the economizer mode or active mode is used. In the economizer mode, the diverter valve 620 directs the primary cooling medium 602 from the cooling coil 612 to the second coil 614 to cool the primary cooling medium 602. Scavenger air 118 is directed across an outer surface of the second coil 614 by the scavenger fans 120. The heat in the primary cooling medium 602 is then rejected from the primary cooling medium 602 and absorbed by the scavenger air 118. The primary cooling medium 602 then returns to the cooling coil 612. The cooling coil 612 and second coil 614 may be any suitable coil including finned tube coils or microchannel coils, for example. An expansion tank 622 may be located upstream of the pump 618 and after the cooling coil 612.

FIG. 17 shows the cooling system 110 in the active mode. As with the active modes discussed above, the active mode of this embodiment is used when the ambient temperature is greater than the temperature of the primary cooling medium 602 after it has absorbed the heat from the return air 114 or within the predetermined temperature differential. In the active mode, the diverter valve 620 directs the primary cooling medium 602 from the cooling coil 612 to the heat exchanger 616 to cool the primary cooling medium 602. The heat in the primary cooling medium 602 is then rejected from the primary cooling medium 602 and absorbed by a secondary cooling medium 208 of a secondary cooling system 230. As discussed in the embodiments above, the secondary cooling system 230 may be any suitable cooling system including a direct expansion cooling system. The primary cooling medium 602 then returns to the cooling coil 612.

Although this invention has been described in certain specific exemplary embodiments, many additional modifications and variations will be apparent to those skilled in the art in light of this disclosure. It is, therefore, to be understood that this invention may be practiced otherwise than as specifically described. Thus, the exemplary embodiments of the invention should be considered in all respects to be illustrative and not restrictive, and the scope of the invention to be determined by any claims supportable by this application and the equivalents thereof, rather than by the foregoing description.

What is claimed is:

1. An airstream cooling assembly operable in passive and active modes, the airstream cooling assembly comprising:
    an evaporator having an outer surface and containing a primary cooling medium, the evaporator being configured to have a first airstream directed over the outer surface thereof and, when the first airstream is directed over the outer surface, to change the phase of the primary cooling medium from liquid to gas;
    a passive condenser having an outer surface and being fluidly coupled to the evaporator; and
    a heat exchanger fluidly coupled to the evaporator,
    wherein, in the passive mode, the passive condenser is configured to:
        receive the primary cooling medium in the gas phase from the evaporator,
        receive a second airstream directed over its outer surface to change the phase of the primary cooling medium from gas to liquid, and
        supply the primary cooling medium in the liquid phase to the evaporator without the heat exchanger supplying the primary cooling medium in the liquid phase to the evaporator without a pump configured to circulate the primary cooling medium in the flow path of the primary cooling medium between the passive condenser and the evaporator,
    wherein, in the active mode, the heat exchanger is configured to:
        receive the primary cooling medium in the gas phase from the evaporator,
        transfer heat from the primary cooling medium to change the primary cooling medium from a gas to a liquid, and
        supply the primary cooling medium in the liquid phase to the evaporator without the passive condenser supplying the primary cooling medium in the liquid phase to the evaporator without a pump configured to circulate the primary cooling medium in the flow path of the primary cooling medium between the heat exchanger and the evaporator, and
    wherein the airstream cooling assembly is configured to switch between the passive mode and the active mode without operating any valves located between the evaporator and the passive condenser and between the evaporator and the heat exchanger.

2. The airstream cooling assembly of claim 1, wherein at least one of the evaporator and the passive condenser is a tube coil.

3. The airstream cooling assembly of claim 1, wherein at least one of the evaporator and passive condenser is a microchannel coil.

4. The airstream cooling assembly of claim 1, wherein the evaporator is a microchannel coil having a liquid side and a vapor side and including a header on the vapor side having a plurality of vapor connections.

5. The airstream cooling assembly of claim 1, wherein the passive condenser has a liquid side and a vapor side and the passive condenser is a microchannel coil including a header on the vapor side having a plurality of vapor connections.

6. The airstream cooling assembly of claim 1, wherein the heat exchanger is a plate heat exchanger and utilizes a secondary cooling medium.

7. The airstream cooling assembly of claim 1, wherein the heat exchanger is a coaxial heat exchanger and utilizes a secondary cooling medium.

8. The airstream cooling assembly of claim 1, wherein the heat exchanger is cooled by a direct expansion cooling system including a compressor and an expansion valve.

9. The airstream cooling assembly of claim 1, wherein the heat exchanger is cooled by chilled water.

10. The airstream cooling assembly of claim 1, wherein the passive condenser and the heat exchanger are arranged in parallel relative to the flow of the primary cooling medium.

11. The airstream cooling assembly of claim 1, further comprising a controller configured to selectively control the mode of the airstream cooling assembly.

12. The airstream cooling assembly of claim 11, wherein the controller is configured to switch to the active mode by supplying a secondary cooling medium to cool the heat exchanger, and
    wherein the controller is configured to switch to the passive mode by turning off the supply of the secondary cooling medium.

13. The airstream cooling assembly of claim 11, further comprising:
    an airstream temperature sensor communicatively coupled to the controller and configured to measure the temperature of the first airstream at a position downstream of the evaporator,
    wherein the controller is further configured to:
        receive a signal representative of the temperature of the first airstream from the airstream temperature sensor; and
        switch to the active mode when the temperature of the first airstream is above a set point.

14. The airstream cooling assembly of claim 11, further comprising:
    an airstream temperature sensor communicatively coupled to the controller and configured to measure the temperature of the first airstream at a position downstream of the evaporator, wherein the controller is further configured to:
receive a signal representative of the temperature of the first airstream from the airstream temperature sensor; and
switch to the passive mode when the temperature of the first airstream is below a set point.

15. A cooling system comprising a plurality of airstream cooling assemblies of claim 1.

16. The cooling system of claim 15, wherein the evaporator of a first one and a second one of the plurality of cooling assemblies are arranged in series relative to the first airstream.

17. The cooling system of claim 15, wherein the evaporator of a first one and a second one of the plurality of cooling assemblies are arranged in parallel relative to the first airstream.

18. The cooling system of claim 15, wherein the passive condensers of a first one and a second one of the plurality of cooling assemblies are arranged in series relative to the second airstream.

19. The cooling system of claim 15, wherein the passive condensers of a first one and a second one of the plurality of cooling assemblies are arranged in parallel relative to the second airstream.

20. An airstream cooling assembly comprising:
an evaporator having an outer surface and containing a primary cooling medium, the evaporator being configured to have a first airstream directed over the outer surface thereof and, when the first airstream is directed over the outer surface, to change the phase of the primary cooling medium from liquid to gas;
a heat exchanger fluidly coupled to the evaporator and configured to accept a secondary cooling medium, wherein, when accepting the secondary cooling medium, the heat exchanger is configured to receive the primary cooling medium in the gas phase from the evaporator, transfer heat from the primary cooling medium, and change the phase of the primary cooling medium from gas to liquid; and
a passive condenser having an outer surface and being fluidly coupled to the evaporator, the passive condenser being configured to have a second airstream directed over the outer surface thereof, wherein, when the heat exchanger is not accepting the secondary cooling medium, the passive condenser is configured to receive the primary cooling medium in the gas phase from the evaporator, transfer heat from the primary cooling medium, and change the phase of the primary cooling medium from gas to liquid,
wherein the evaporator is configured to receive the primary cooling medium in the liquid phase from either the heat exchanger or the passive condenser without a pump configured to circulate the primary cooling medium in the flow path of the primary cooling medium between the heat exchanger and the evaporator and between the passive condenser and the evaporator, and
wherein the airstream cooling assembly is configured to switch between the heat exchanger receiving the primary cooling medium in the gas phase from the evaporator and the passive condenser receiving the primary cooling medium in the gas phase from the evaporator without operating any valves located between the evaporator and the passive condenser and between the evaporator and the heat exchanger.

21. An airstream cooling assembly comprising:
an evaporator having an outer surface and containing a primary cooling medium, the evaporator being configured to have an airstream directed over the outer surface thereof and, when the airstream is directed over the outer surface, to change the phase of the primary cooling medium from liquid to gas;
a passive condenser having an outer surface and being coupled to the evaporator, the passive condenser being configured to have ambient air directed over the outer surface thereof, transfer heat from the primary cooling medium, and change the phase of the primary cooling medium from gas to liquid; and
a heat exchanger coupled to the evaporator and configured to selectively accept heat from the primary cooling medium by mechanical cooling and change the phase of the primary cooling medium from gas to liquid, the heat exchanger configured to selectively accept heat from the primary cooling medium without operating any valves to direct the primary cooling medium to the heat exchanger instead of the passive condenser,
wherein the evaporator is configured to receive the primary cooling medium in the liquid phase from either the passive condenser or the heat exchanger without a pump configured to circulate the primary cooling medium in the flow path of the primary cooling medium between the heat exchanger and the evaporator and between the passive condenser and the evaporator, the evaporator being configured to receive the primary cooling medium in the liquid phase from the heat exchanger when the heat exchanger is accepting heat by mechanical cooling.

22. A method of cooling an airstream, the method comprising:
directing an airstream over an outer surface of an evaporator to change a primary cooling medium contained therein from a liquid phase to a gas phase;
selectively utilizing one of a heat exchanger and a passive condenser to change the primary cooling medium from the gas phase to the liquid phase, each of the heat exchanger and the passive condenser being coupled to the evaporator to receive the primary cooling medium in the gas phase from the evaporator and supply the primary cooling medium in the liquid phase to the evaporator; and
circulating the primary cooling medium between the evaporator and at least one of the heat exchanger and the passive condenser by natural circulation,
wherein the one of the a heat exchanger and a passive condenser is selected without operating any valves in the coupling between the evaporator and the passive condenser and in the coupling between the evaporator and the heat exchanger.

23. The method of claim 22, wherein cooling the heat exchanger comprises using a secondary cooling medium to change the phase of the primary cooling medium from gas to liquid.

24. The method of claim 22, wherein cooling the passive condenser comprises directing an airstream over the passive condenser, the airstream directed over the passive condenser being from a different source than the airstream directed over the evaporator.

* * * * *